United States Patent [19]

Frailing et al.

[11] 4,193,025
[45] Mar. 11, 1980

[54] AUTOMATIC BATTERY ANALYZER

[75] Inventors: Charles E. Frailing, Milwaukee; Thomas J. Dougherty, Waukesha, both of Wis.

[73] Assignee: Globe-Union, Inc., Milwaukee, Wis.

[21] Appl. No.: 863,925

[22] Filed: Dec. 23, 1977

[51] Int. Cl.² ............................................. G01N 27/42
[52] U.S. Cl. ..................................... 324/427; 320/48; 324/430
[58] Field of Search .......................... 324/29.5; 320/48

[56] References Cited

U.S. PATENT DOCUMENTS

| | | | |
|---|---|---|---|
| 2,853,676 | 9/1958 | Ellis | 324/29.5 |
| 3,753,094 | 8/1973 | Furuishi et al. | 324/29.5 |
| 3,873,911 | 3/1975 | Champlin | 324/29.5 |
| 3,997,834 | 12/1976 | Winter | 324/29.5 |
| 4,052,717 | 10/1977 | Arnold | 324/29.5 |
| 4,080,560 | 3/1978 | Abert | 324/29.5 |

OTHER PUBLICATIONS

Paper by Keith S. Champlin purportedly presented at the 1975 SAE Off-Highway Vehicle Meeting entitled "Dynamic Method for Storage Battery Diagnostic Testing".
Preliminary Specification Sheet for "Motorola Electronic Battery Tester".
Brochure, Motorola Automotive Products Division, "6/12 Volt Electronic Battery Tester", Form. No. AP-192-75.
Owners Manual, "Motorola Electronic Battery Tester", Motorola Inc. Automotive Products Division, 68P44805A04-O(7BT1181W).
Operating Instruction, "Motorola Electronic Battery Tester", Motorola Inc., Automotive Products Division, 68P44801A94-A (8TE2003).
Sears Operating Instruction, "Motorola Electronic Battery Tester", Part. No. 68P44805A03-O (8TE2005).
Globe-Union Inc. memorandum dated Nov. 14, 1973 from C. E. Wright to R. E. Hoffman entitled "Motorola Electronic Battery Tester".
Manual, Christie Electric Corp., 3410 West 67th Street, Los Angeles, Calif. 90043.
Manual, "Battery Service and Testing Procedures", Motorcraft Ford, undated, pp. 26-28.

*Primary Examiner*—M. Tokar
*Attorney, Agent, or Firm*—Neuman, Williams, Anderson & Olson

[57] ABSTRACT

Apparatus for automatically testing automotive-type, lead acid storage batteries are disclosed in which three separate tests are made and the results thereof compared to predetermined standards in a specified order to maximize the information obtained about the battery. The three tests measure (1) whether the battery meets its cold cranking rating by drawing a predetermined load current therefrom for a predetermined period of time and determining whether the battery terminal voltage is above a specified level at the end of that period, (2) whether the battery terminal voltage is above another specified level at the end of a predetermined period of time following the completion of the first test, and (3) whether the internal resistance is acceptably low. If the battery passes the first test, it is known to be acceptable. If the battery fails the first test and passes the second test, it is known to be unacceptable. If the battery fails the first and second tests, the third test is performed. If the battery then passes the third test, it is known to be acceptable but to require a recharge, whereas if the battery then fails the third test the acceptability of the battery is then not yet determined and it must be recharged and retested.

19 Claims, 17 Drawing Figures

AUTOMATIC BATTERY ANALYZER

BACKGROUND OF THE INVENTION

This invention relates to apparatus for automatically testing electrical storage batteries and, in particular, relates to apparatus for automatically testing lead-acid storage batteries of the type conventionally used for lighting, starting and ignition in the automotive field.

The desirability of adequate methods and apparatus for quickly, economically and simply determining the acceptability of electrical storage batteries has long been known; the desire for such methods and apparatus for use with lead-acid storage batteries of the type generally used for lighting, starting and ignition in automotive applications has been particularly accute. Automotive batteries are required to operate under widely varying loads and at widely varying temperatures. However, the most severe condition which an automobile battery in typical use must meet is the starting of an automobile engine at low temperatures. The electric starter of an automobile is typically the largest single load placed on the battery and at low temperatures the load is increased even further because of the increased viscosity of the lubricants used in automobile motors. Additionally, automobile batteries are typically least able to deliver large amounts of current to heavy loads at low temperatures. It is, desirable, of course, for a motorist to be able to quickly and easily determine whether the battery of his automobile is in sufficiently good condition that it will be able to start that automobile under low temperature conditions without having to await the occurrence of those conditions. It is important that methods and apparatus for testing the acceptability of automotive batteries be reliable not only so that motorists may be given a true indication of when their batteries need to be replaced, but also because such methods and apparatus are used by manufacturers and sellers of automotive batteries to determine whether such batteries need to be replaced under applicable warranty provisions. It is apparent that those in the automotive battery business desire to have neither the dissatisfied customers and attendant bad will resultant from supplying batteries to customers that pass the test measures used but will not perform acceptably and, in particular, will not start their customers' automobiles under low temperature conditions, nor the unnecessary expense resultant from replacing under warranty provisions batteries that fail the test measures but would, in fact, perform acceptably in use.

In large measure because of the criticallity of the low temperature performance of automotive batteries, the Battery Council International and the Society of Automotive Engineers have developed a standard for automobile batteries known as the "cold cranking rating". The cold cranking rating of an automobile battery is measured in amperes and is the current which the battery is able to deliver for a period of thirty seconds at a temperature of zero degrees Farenheit without the battery terminal voltage falling below a predetermined level, which level in the case of conventional, six-cell, twelve-volt lead-acid storage batteries is 7.2 volts.

One method for testing the condition of lead-acid batteries which has been used for many years has been to subject the battery to a constant current load for a specific period of time and measure the voltage across the battery at the end of that period with the battery still subject to the load. If the battery voltage at the end of the period was below a predetermined level, a hydrometer then was used to determine the state of charge of each one of the battery cells by measuring the specific gravity of the acid within it. Typically with such tests, if the temperature of the battery was other than 80 degrees Farenheit, in order to achieve accurate results both the current load test and the specific gravity readings had to be corrected for changes in temperature. These measurements, the temperature correction, and the ultimate determination of whether or not a battery was an acceptable one, i.e., whether it needed to be replaced, required some amount of training and skill. Further, it required removal of the battery vent caps for access to the liquid within the battery cells.

However, many automotive batteries commercially available today are designed to operate for their entire lifetime with no or very infrequent replacement or replenishment of the liquid contained within them and, thus, are provided with either no means for access to the liquid contained within the battery or only limited means for such access suitable for only infrequent use. For batteries such as these, testing apparatus must be provided which does not require access to the interior of the battery. In general, the only way to test a battery is then to measure its electrical parameters at the battery terminals. A simple electrical load test with monitoring of the terminal voltage as described above might be used alone, but then each battery would have to be fully charged prior to commencing the test, an undesirable alternative because of the time required to properly fully charge a battery.

Other battery testing methods and apparatus have, of course, been proposed over the years as alternatives to the load test described. Some such apparatus are described in U.S. Pat. No. 3,873,911 to Keith S. Champlin dated Mar. 25, 1975, entitled "Electronic Battery Testing Device" and in a paper by Keith S. Champlin purportedly presented at the 1975 SAE Off-Highway Vehicle Meeting and available from the Society of Automotive Engineers, Inc., 400 Commonwealth Dr., Warrendale, Pa. 15096, and such devices are sold under the name Electronic Battery Tester from Motorola, Inc., Automotive Products Division, 9401 West Grand Ave., Franklin Park, Ill. 60131, Models 8TE 2003 and 7BT1181W. Each of these apparatus is electronic in nature and purports to measure the dynamic conductance of the battery which is said to be proportional to the maximum power available from the battery. The Motorola, Inc. Electronic Battery Tester includes provisions for indicating to the user a direct reading of the maximum power available from the battery or the battery terminal voltage and for comparing the measured maximum power with a value determined from the manufacturer's cold cranking rating to give the user a "pass-fail" indication. Apparatus are purportedly described in U.S. Pat. No. 3,753,094 to Haruhisa Furuishi, et al., dated Aug. 14, 1973, entitled "Ohmmeter for Measuring the Internal Resistance of a Battery and Directly Reading the Measured Resistance Value" for measuring the internal resistance of a battery. However, these apparatus and methods continue to have disadvantages associated therewith. For example, the Motorola, Inc. Electronic Battery Tester referred to above may give incorrect results immediately after the battery has been subject to a high level charging current or when a short exists in the battery.

In the development of methods and apparatus for testing batteries it is desirable to make effective use of as much information as may be obtained about the condition of the battery as possible but this, of course, must be done within certain constraints as it is undesirable that the testing apparatus be unduly expensive or that the testing procedure consume an unnecessarily long period of time. Further, in developing such methods and apparatus where a plurality of separate tests are performed on the battery it is highly desirable that the tests be structured in such a way as to prevent "looping", i.e., the repetition of one or more test steps during a test operation. Such repetition can be time consuming but can also result in a failure of the test apparatus to arrive at a definitive indication of battery acceptability if a condition should arise where the apparatus by normal operation was unable to get out of the loop and merely continuously repeated the tests in the loop. In the development of battery testing methods and apparatus it is also desirable to have the ultimate judgment of the acceptability of the battery subject to as little operator interpretation or judgment as possible. In particular, it is desirable that battery testing apparatus be capable of use by relatively unskilled personnel.

SUMMARY

It is, thus, an object of this invention to provide methods and apparatus for determining the acceptability of electrical storage batteries which has particular applicability for use with lead-acid storage batteries of the type conventionally used in the automotive field.

It is an object of this invention to provide such methods and apparatus which are characterized by a high degree of accuracy and reliability.

It is an object of this invention to provide such methods and apparatus which are characterized by ease of use and a requirement of little or no interpretation by the operator.

It is an object of this invention to provide such methods and apparatus which take advantage of the maximum of useful information which can be determined from the electrical parameters of the batteries being tested consistant with the economics involved and other desiderata referred to above.

It is an object of this invention to provide such methods and apparatus which require no access to the interior of the battery.

It is an object of this invention to provide such methods and apparatus which do not require complete recharging of every battery prior to testing it and do not otherwise require an excessive amount of time to complete the testing procedure.

It is an object of this invention to provide such methods and apparatus wherein the accuracy or reliability thereof is not impared by the charging history of the battery being tested.

It is an object of this invention to provide such methods and apparatus having fully automatic operation wherein a minimum of functions are performed by the operator.

It is an object of this invention to provide such methods and apparatus including means for automatically compensating for the temperature of the battery being tested.

Further and additional objects of this invention will be apparent to those having skill in the art from this specification, the claims and the appended drawing.

Battery analyzing methods and apparatus are provided by this invention fulfilling the above-mentioned and other objects wherein the battery under test is first subjected to a load test by drawing current therefrom for a predetermined period and determining at the end of that period whether the battery terminal voltage is above a first specified value; if the terminal voltage is below that first value, a second, voltage bounce-back test is performed wherein the battery terminal voltage is measured again at the end of a second predetermined period after the load has been removed and it is determined whether the battery terminal voltage is above a second specified value; if the terminal voltage is below that second value, an internal circuit characteristic of the battery is measured to determine whether the battery is discharged and merely requires to be recharged or whether it should be recharged and retested. If the first test is passed with the battery terminal voltage at the end thereof being above the first specified value, the battery is known to be acceptable and further tests may be dispensed with. If the first test is failed, the condition of the battery is not known but if the second test is then passed, i.e., the battery terminal voltage being above the second specified value at the end thereof, the battery is known to be unacceptable and further tests may be dispensed with. If the second test is failed, then the third test is performed and the results thereof indicate whether or not the results from the previous two tests were obtained only because the battery was discharged; if that is the case the battery is known to be acceptable and need not be further tested but should be recharged before being returned to service, but if it is not the case, the battery should be recharged and tested again. On retesting of a battery after recharging it, only the first of the three described tests need be performed as passage or failure of that test is a positive indication of the acceptability or unacceptability of the battery under test when the battery is known to be fully charged.

A more detailed explanation of methods and apparatus embodying this invention will now be made with reference to the attached drawing.

DESCRIPTION OF THE PREFERRED EMBODIMENTS

Figure 1A:
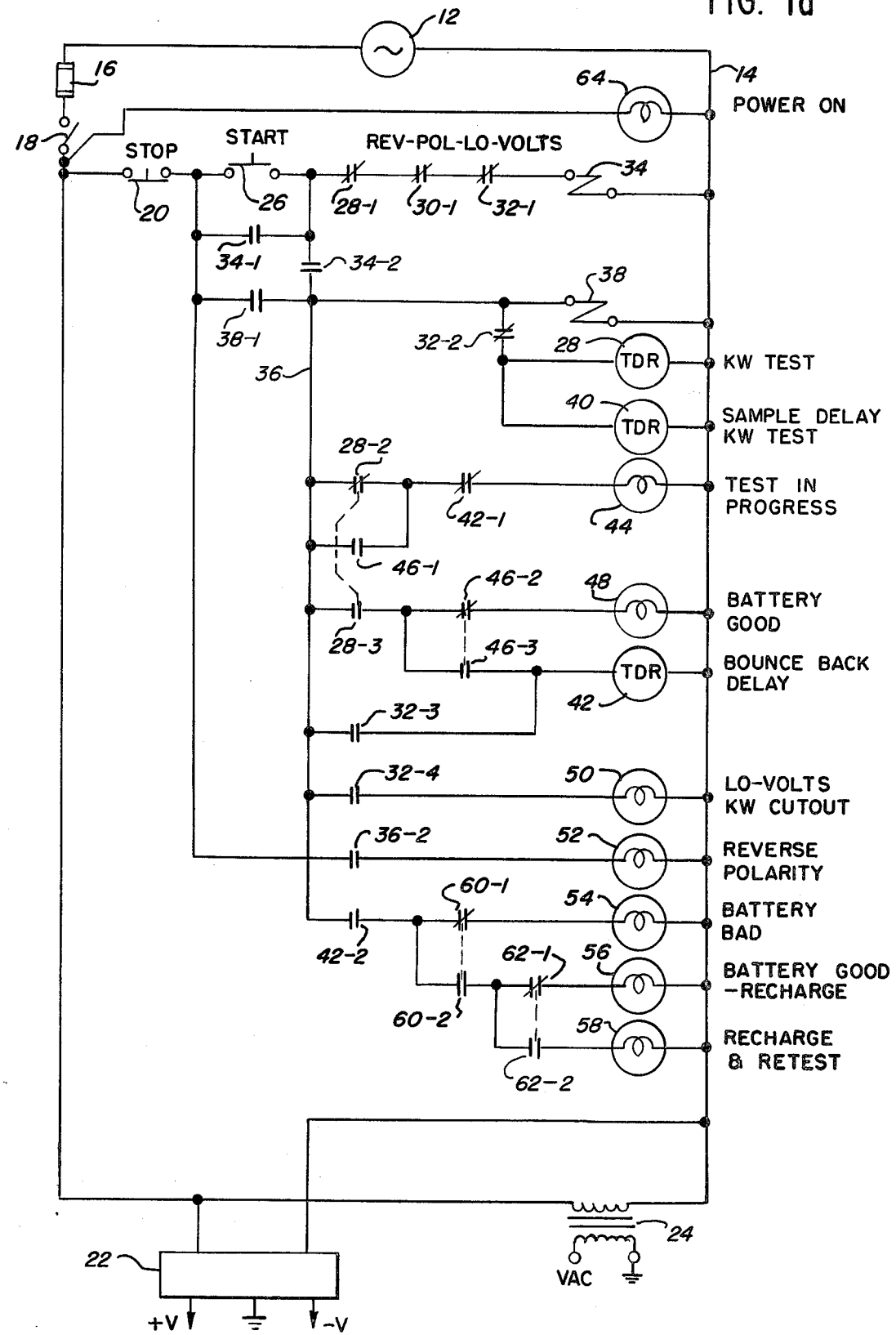
FIG. 1 is divided into FIGS. 1a–1e which disclose a first automatic battery analyzer making use of this invention.

There are disclosed in FIGS. 1 and 2 automatic battery analyzers of this invention which perform multiple tests on the battery under test and compare the results of those tests to predetermined standards in a specified and advantageous order. The order in which the comparisons are made is selected to maximize the information obtained concerning the battery under test within the limitations of the time available to make the tests and the permissible cost of the analyzer and to maximize the reliability of the results supplied by the analyzer within the same constraints. In the apparatus of FIGS. 1 and 2, the separate tests are made in the same sequence as the order in which the various comparisons are made. Thus, if the battery under test is determined to be good or bad by any tests already completed, the analysis may be terminated without performing the remaining tests. The tests could be made in a different order.

As will be discussed in more detail subsequently, three tests are performed by the apparatus of FIGS. 1 and 2 in the following order:

1. The battery is subjected to a load test to see if it concurs with its cold cranking rating capacity. The test is performed by placing a load across the battery such that the battery delivers a specified current to that load for a predetermined time period. If at the end of that time period and with the load still on the battery the battery terminal voltage exceeds a predetermined value, the battery is known to be acceptable and further tests may be dispensed with. If the battery terminal voltage at the end of that time period is less than the predetermined value, it is not known whether or not the battery is acceptable, as it might merely have been partially discharged. Circuitry is also provided for terminating this cold cranking power test if during the time the battery is under load the terminal voltage falls below a minimum value in order to avoid deeply discharging the battery unnecessarily.

2. If the battery failed the cold cranking power test, it is tested to see if the terminal voltage bounces back to within a predetermined percent of its rated voltage after a predetermined time period. If the battery failed the cold cranking power test but passes this voltage bounce-back test, it is known that the battery did not fail the cold cranking power test merely because it was discharged and the battery is, in fact, an unacceptable one. If the battery fails both the cold cranking power test and the voltage bounce-back test, its condition is still not known.

3. If the battery fails both the cold cranking power test and the voltage bounce-back test, the battery is tested to see if an internal circuit parameter of the battery is above or below a specified value. The circuit parameter used in the apparatus of FIGS. 1 and 2 is the battery dynamic internal resistance or conductance. If the internal resistance is above the specified value, it is known that the battery needs to be recharged and retested. If the internal resistance is below a specified value, it is known that the battery is acceptable but merely needs a recharge.

The circuitry of FIG. 1 is shown in five separate figures, FIGS. 1a–1e, for ease of drawing. The convention that like lettered circuit points are electrically connected to each other is used. Where useful for ease of understanding, the particular one of FIGS. 1a–1e in which a particular element appears is placed in parentheses after the element reference number.

The automatic battery analyzer of FIG. 1 is used to test a lead-acid battery 10 (FIG. 1b) of the type conventionally used for automotive starting, lighting, and ignition applications. The analyzer includes a circuit point A for connection to the positive terminal of battery 10 and a circuit point B for connection to the negative terminal of battery 10. Power for the analyzer is supplied from the conventionally available source of 110–120 volt, 60 hertz power 12 (FIG. 1a). One side of source 12 is coupled to an a.c. power bus 14, while the other side is coupled through the series combination of a fuse 16 and a power switch 18 to a first terminal of a normally closed push button switch 20. A power supply 22 is coupled between a.c. bus 14 and the first terminal of switch 20 and provides plus and minus direct current potentials $+V$ and $-V$ at two outputs thereof with respect to a common output coupled to a circuit ground. A transformer 24 has a primary winding coupled between a.c. bus 14 and the first terminal of switch 20 and includes a secondary winding which provides between two terminals thereof an alternating, low voltage supply. One terminal of that secondary winding is coupled to circuit ground, and the other is connected to a terminal point VAC.

The series combination of a normally open push button switch 26, a normally closed first set of contacts 28-1 forming a part of a first time delay relay 28, a normally closed set of contacts 30-1 forming a part of a first relay 30 (FIG. 1b), a normally closed set of contacts 32-1 forming a part of a second relay 32 (FIG. 1d), and the coil of a third relay 34 are coupled in series between the second terminal of switch 20 and a.c. bus 14. A normally open first set of contacts 34-1 is coupled in parallel with push button switch 26, and a normally open second set of contacts 34-2 is coupled between a line 36 and the junction of switch 26 and contacts 28-1. Contact sets 34-1 and 34-2 both form a part of relay 34. The coil of a fourth relay 38 is coupled between line 30 and a.c. bus 14, while a normally open first set of contacts 38-1 forming a part of that relay is connected between the second terminal of switch 20 and line 36. One side of a normally closed second set of contacts 32-2 forming a part of second relay 32 is coupled to line 36, while the other side thereof is coupled to a.c. bus 14 through the parallel combination of the coil of first time delay relay 28 and the coil of a second time delay relay 40. The series combination of a normally closed set of contacts 28-2 forming a part of first time delay relay 28, a normally closed first set of contacts 42-1 forming a part of a third time delay relay 42, and a first incandescent lamp 44 is coupled between line 36 and a.c. bus 14. A normally open first set of contacts 46-1 forming a part of a fifth relay 46 (FIG. 1c) is coupled in parallel with normally closed set of contacts 28-2. The series combination of a normally open second set of contacts 28-3 forming a part of first time delay relay 28, a normally closed second set of contacts 46-2 forming a part of fifth relay 46, and a second incandescent lamp 48 is also coupled between line 36 and a.c. bus 14, while in the last recited two elements of that combination have coupled in parallel therewith the series combination of a normally closed third set of contacts 46-3 forming a part of fifth relay 46 and the winding of the third time delay relay 42. A normally open third set of contacts 32-3 forming a part of second relay 32 is coupled between line 36 and the junction of normally closed set of contacts 46-3 and the coil of time delay relay 42. A normally open fourth set of contacts 32-4 forming a part of second relay 32 and a fourth incandescent lamp 50 are coupled in series between line 36 and a.c. bus 14, while a normally open second set of contacts 30-2 forming a part of first relay 30 and a fifth incandescent lamp 52 are coupled in series between the second terminal of push button switch 20 and a.c. bus 14. Fourth, fifth, and sixth incandescent lamp 54, 56, and 58, respectively, have one terminal connected to a.c. bus 14. A second terminal of lamp 54 is coupled through the series combination of a normally open first set of contacts 60-1 forming a part of sixth relay 60 (FIG. 1d) and a normally open second set of contacts 42-2 forming a part of third time delay relay 42 to line 36; a second terminal of lamp 56 is coupled through the series combination of a normally closed first set of contacts 62-1 forming a part of seventh relay 62 (FIG. 1e) and a normally open second set of contacts 60-2 forming a part of sixth relay 60 to the junction of normally open set of contacts 42-2 and normally closed set of contacts 60-1; and a second terminal of lamp 58 is coupled through a normally closed second set of contacts 62-2 forming a part of seventh relay 62 to the junction of normally open set of contacts 60-2 and normally closed set of contacts 62-1. A seventh incandescent lamp 64 is coupled between the first terminal of normally closed switch 20 and a.c. bus 14.

The circuit of the analyzer as thus far described with reference to FIG. 1a permits the operator to start and stop the operation of the analyzer while the first through seventh incandescent lamps indicate the status of the analyzer and the results of the tests performed. Switch 18 applies power to the analyzer and illuminates lamp 64. Depression of switch 26 places the analyzer in operation and depression of switch 20 terminates the operation. As will subsequently become evident, illumination of lamp 44 indicates that an analysis of the battery under test is in progress, illumination of lamp 48 indicates the battery under test is acceptable, illumination of lamp 50 indicates the cold cranking power test has been terminated because the terminal voltage of the battery under test dropped excessively low, illumination of lamp 52 indicates the battery under test has been connected to the analyzer with the incorrect polarity and should be reversed, illumination of lamp 54 indicates the battery under test is unacceptable, illumination of lamp 56 indicates that the battery under test is acceptable but should be recharged, and illumination of lamp 58 indicates the battery under test should be recharged and tested again.

Figure 1B:
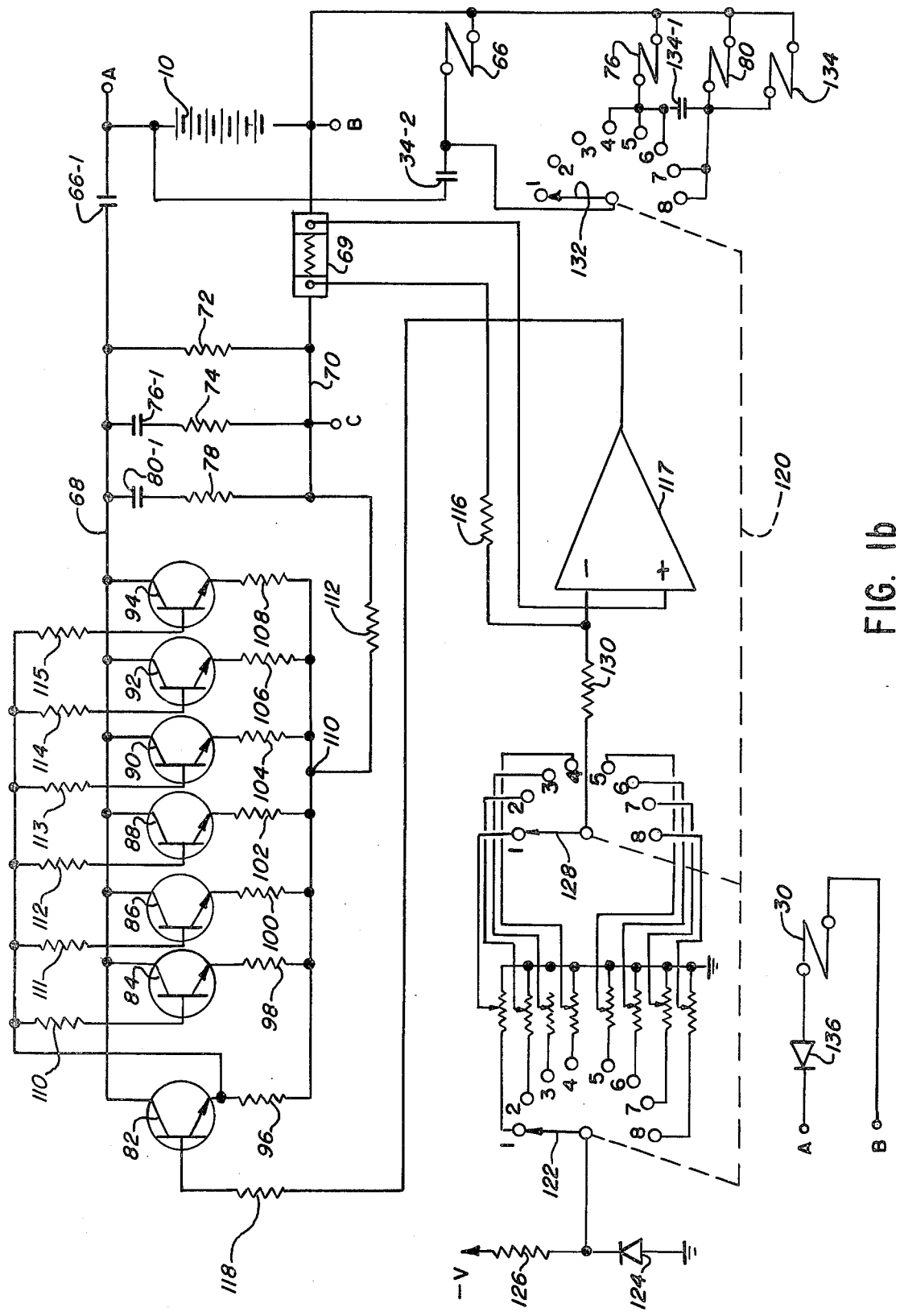
Figure 1C:
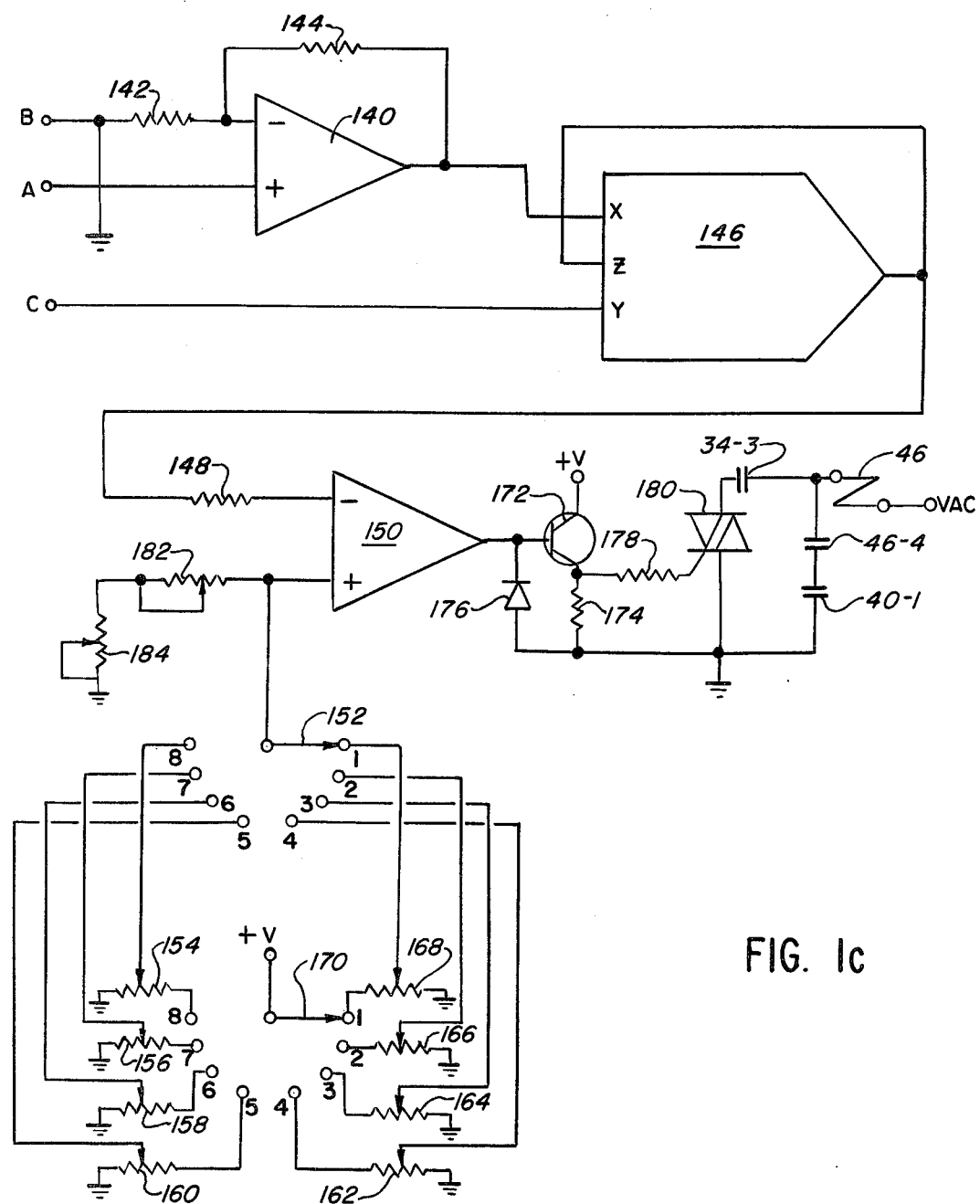

The circuitry which performs the cold cranking power test is shown for the most part in FIGS. 1b and 1c. The circuit of FIG. 1b primarily performs the function of drawing a predetermined load current from the battery under test while the circuit of FIG. 1c determines whether the cold cranking power specification is met. The load circuit includes a network of fixed resistors to dissipate the greater portion of the battery load and an electrically variable resistance network connected in a feedback arrangement to maintain the battery load current at the desired level. The level of battery load current is manually adjustable to correspond with the cold cranking power rating of the battery under test.

Circuit point A is coupled through a normally open first set of contacts 66-1 forming a part of an eighth relay 66 to a first current bus 68, and circuit point B is coupled through a shunt resistor 69 to a second current bus 70. A circuit point C is coupled to current bus 70. A resistor 72 is coupled between the current buses 68 and 70 as are the series combination of a resistor 74 and a normally open set of contacts 76-1 forming a part of a ninth relay 76 and the series combination of a resistor 78 and a normally open first set of contacts 80-1 forming a part of a tenth relay 80. First current bus 68 is coupled to the collectors of each of seven transistors 82, 84, 86, 88, 90, 92, and 94, the emitters thereof each being coupled through resistors 96, 98, 100, 102, 104, 106, and 108, respectively, to a circuit point 110. That circuit point is coupled to second current bus 70 through a resistor 112. The emitter of transistor 82 is separately connected to the base of each transistor 84, 86, 88, 90, 92, and 94 through resistors 110, 111, 112, 113, 114, and 115, respectively. Second current bus 70 is coupled through a resistor 116 to the inverting input of an operational amplifier 117, and circuit point B is coupled to the non-inverting input of that same amplifier. The output of amplifier 117 is coupled through a resistor 118 to the base of transistor 82.

A five pole, eight position rotary switch 120 is provided. Its position is selected according to the cold cranking power rating of the battery under test. The first armature 122 of switch 120 is coupled to the cathode of a diode 124 having its anode coupled to circuit ground and to the negative supply source −V through a resistor 126. Each of the eight contacts 1-8 associated with armature 122 is separately coupled through the resistance element of an associated potentiometer to circuit ground, and the wiper arm of each of those potentiometers is coupled to the corresponding one of the eight contacts 1-8 associated with the second armature 128 of switch 120. The second armature is coupled through a resistor 130 to the inverting input of amplifier 117. Circuit point A is coupled through a normally open second set of contacts 34-2 forming a part of third relay 34 to the third armature 132 of switch 120. That armature is also coupled through the coil of eighth relay 66 to circuit point B. Terminals 4, 5, and 6 associated with third armature 132 are coupled together and to circuit point B through the coil of ninth relay 76 whereas terminals 7 and 8 of that armature are coupled together and to circuit point B through the parallel combination of the coils of tenth relay 80 and an eleventh relay 134. A normally open first set of contacts 134-1 forming a part of eleventh relay 134 is coupled between the contacts 6 and 7 associated with armature 132.

The voltage developed across the resistor 69 is proportional to the current load on battery 10, which voltage is used as one input to operational amplifier 117. A second input to the operational amplifier is developed at the armature 128 of switch 120 depending on which position switch 120 is in. The potentiometer associated with that switch are adjusted to provide inputs at voltage levels corresponding to the battery load currents for the cold cranking power ratings of the different batteries to be tested with the analyzer. If the battery load current falls below that desired, the potential at the output of operational amplifier 117 tends to increase positively, thus increasing the forward current bias through each of transistor 82, 84, 86, 88, 90, 92 and 94 and increasing the current flow from battery 10 through the collector-emitter circuit of each of those transistors and the battery load current. If the battery load current goes above that desired, the battery load current is correspondingly reduced through a reverse mechanism. The circuitry associated with the third armature 132 of switch 120 tends to increase the battery current which flows through the fixed resistance portion of the circuit at higher battery load currents so that the necessary range of load current adjustment is maintained within the capabilities of the variable resistance portion of the circuit including transistors 82, 84, 86, 88, 90, 92, and 94. Thus, for batteries having relatively low cold cranking power, switch 120 is placed in positions 1, 2, or 3 and resistor 72 is included within the fixed resistance portion of the battery load, but resistors 74 and 78 are excluded therefrom since contacts 76-1 and 80-1 are both open. For batteries having intermediate cold cranking power, switch 120 is placed in position 4, 5, or 6 causing current flow through the winding of ninth relay 76, closing contacts 76-1, including resistor 74 in parallel with resistor 72 in the fixed resistance portion of the battery load, and increasing the current through that portion. For batteries having relatively high cold cranking power, switch 120 is placed in position 7 or 8 causing current flow through the winding of tenth relay 80 which closes contactor 80-1 and includes resistor 78 in the fixed resistance portion of the battery load, and also causing current flow through the winding of eleventh relay 134 which closes contacts 134-1, thus causing current to flow through the winding of ninth relay 76 and including resistor 74 in the fixed resistor portion of the battery load.

There is also shown in FIG. 1b a portion of the circuitry for indicating to the operator that the battery has been attached to the analyzer with the wrong polarity. That circuitry includes the winding of first relay 30 which has one terminal coupled to circuit point B and a second terminal coupled to the anode of a diode 136, which diode has its cathode coupled to circuit point A.

In FIG. 1c, circuit point B is coupled to the circuit ground and circuit point A is coupled to the non-inverting input of an operational amplifier 140. The inverting input of that amplifier is coupled to ground through a resistor 142, and the output of that amplifier is coupled to the inverting input thereof through a feedback resistor 144. The output of that amplifier 140 is also coupled to the X input of multiplier 146 and the Y input thereof is coupled to circuit point C. The output of multiplier 146 is coupled to the Z input thereof. Multiplier 146 develops at its output a signal proportional to the product of the signals present at its X and Y inputs. The output of multiplier 146 is coupled through a resistor 148 to the inverting input of an operational amplifier 150. The noninverting input of amplifier 150 is coupled to a fourth armature 152 of switch 120. Each of the eight contacts 1-8 associated with that armature is connected to the wiper arm of a respective potentiometer 154, 156, 158, 160, 162, 164, 166, and 168. One terminal of the resistance elements of each of those potentiometers is coupled to ground, while the other terminal is coupled to the corresponding one of the eight contacts 1-8 associated with a fifth armature 170 of switch 120. Armture 170 is coupled to the positive potential source +V. The output amplifier 150 is coupled to the base of an npn transistor 172 having its collector coupled to the positive potential source +V and its emitter coupled to ground through a resistor 174. A diode 176 has its cathode coupled to the output of amplifier 150 and its anode coupled to circuit ground. The emitter of transistor 172 is coupled through a resistor 178 to the gate of triac 180. One main terminal of triac 180 is coupled to ground, while the other main terminal is coupled through a normally open third set of contacts forming a part of third relay 34 to a first terminal of the winding of fifth relay 46. The first terminal of that winding is coupled to circuit ground through the series combination of a normally open fourth set of contacts 46-4 forming a part of fifth relay 46 and a normally open first set of contacts 40-1 forming a part of second time delay relay 40; the second terminal of that winding is coupled to the alternating potential source VAC. Two variable resistors 182 and 184 are coupled in series between the noninverting input of amplifier 150 and circuit ground.

Figure 1D:
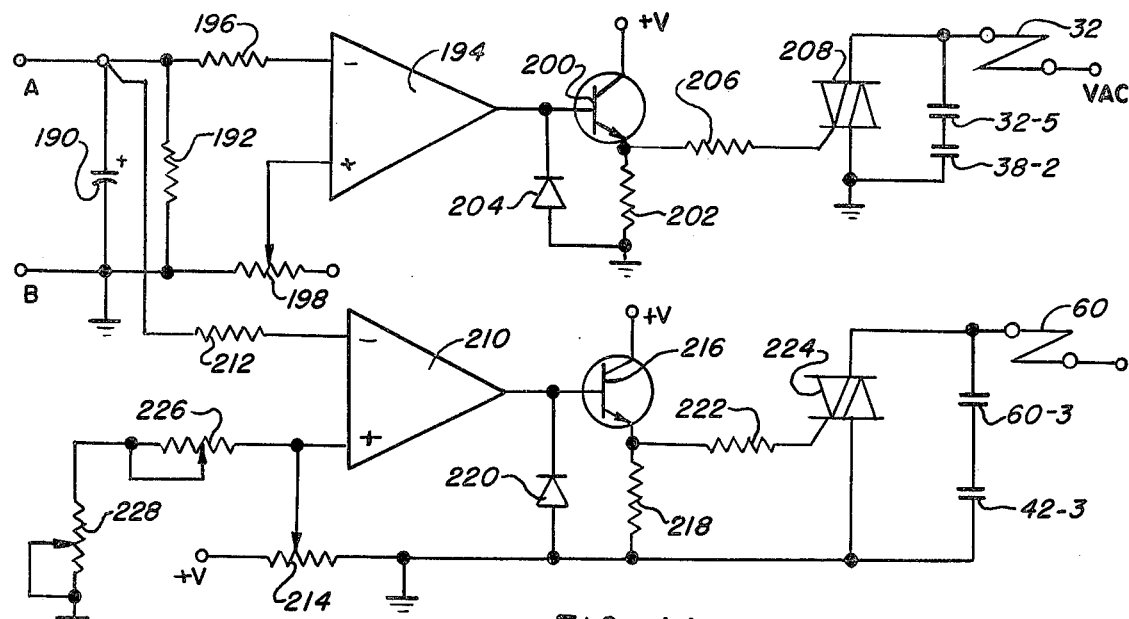

The upper portion of FIG. 1d shows the circuitry primarily concerned with terminating the cold cranking power test if the battery terminal voltage falls below a predetermined value. Circuit point A is coupled to ground through the parallel combination of a capacitor 190 and a resistor 192 and to the inverting input of an operational amplifier 194 through a resistor 196. The noninverting input of that amplifier is coupled to the wiper arm of a potentiometer 198 having its resistance element coupled between the positive potential source +V and circuit ground. The output of that amplifier is coupled to the base of a transistor 200 having its collector coupled to positive potential source +V and its emitter coupled through a resistor 202 to ground. A diode 204 is provided having its cathode coupled to the output of operational amplifier 194 and its anode coupled to circuit ground. The emitter of transistor 200 is coupled through a resistor 206 to the gate of a triac 208. The first main terminal is coupled to a first terminal of the winding of relay 32. The series combination of a normally open fifth set of contacts 32-6 forming a part of relay 34 and a normally open second set of contacts 38-2 associated with relay 38 is connected between the first terminal of that winding and ground; the second terminal of that winding is connected to alternating potential source VAC.

The lower portion of FIG. 1d shows the circuitry primarily concerned with performing the bounce back test. Circuit point A is coupled to the inverting input of an operational amplifier 210 through a resistor 212. The non-inverting input of that amplifier is coupled to the wiper arm of potentiometer 214 having its resistance element coupled between the positive potential source +V and circuit ground. The output of that amplifier is coupled to the base of a transistor 216 having its collector coupled to positive potential source +V and the emitter coupled through a resistor 218 to ground. A diode 220 is provided having its cathode coupled to the output of operational amplifier 210 and its anode coupled to circuit ground. The emitter of transistor 216 is coupled through a resistor 222 to the gate of a triac 224. The first main terminal of triac 224 is coupled to ground and the second main terminal is coupled to a first terminal of the winding of relay 60.

The series combination of a normally open third set of contacts 60-3 forming a part of sixth relay 60 and a normally open third set of contacts 42-3 forming a part of third time delay relay 42 is connected between the first terminal of that winding and ground; the second terminal of that winding is connected to the alternating potential source VAC. The series combination of two variable resistors 226 and 228 are coupled between the noninverting input of operational amplifier 210 and ground.

Figure 1E:
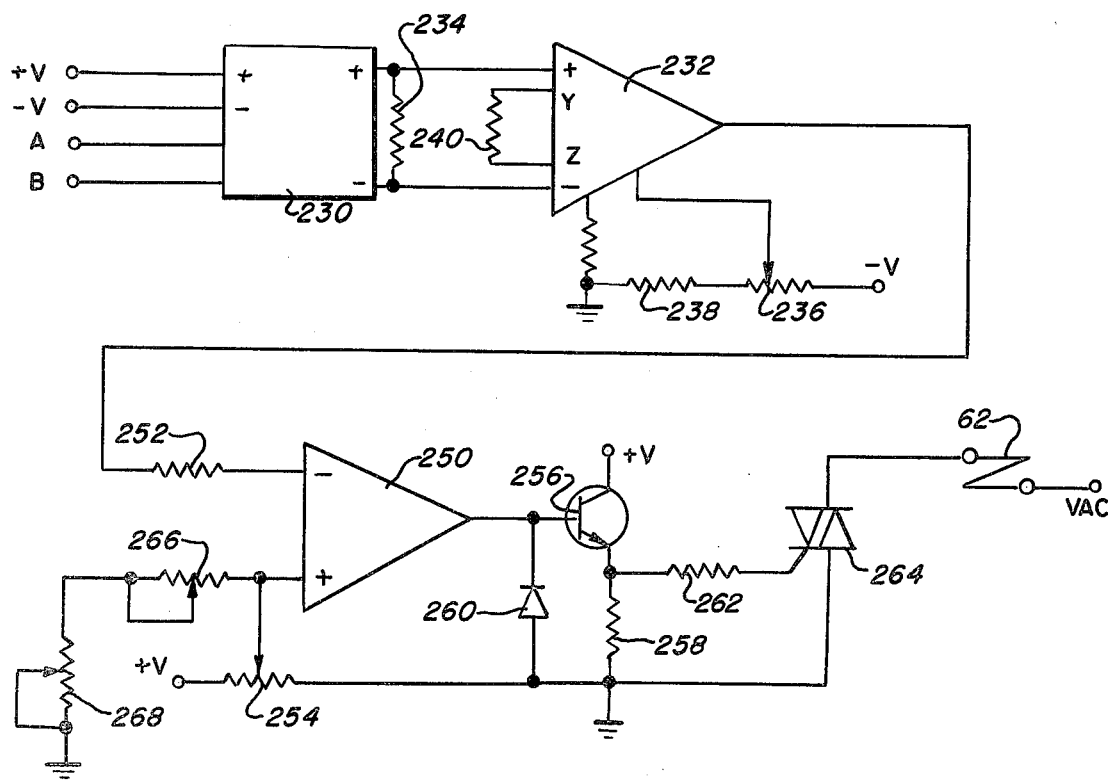

The circuitry primarily concerned with the performance of the internal resistance test is disclosed in FIG. 1e. It includes a dynamic resistance measuring circuit 230 having its power terminals connected to positive and negative potential sources +V and −V and its input terminals connected to terminal points A and B. The positive and negative outputs of the resistance measuring circuit 230 are coupled to the noninverting and inverting inputs, respectively, of an instrumentation amplifier 232 with a resistor 234 coupled therebetween. The Y and Z inputs of instrumentation amplifier 232 are coupled together by a resistor 240. The output of the instrumentation amplifier is coupled to the inverting input of an operational amplifier 250 through a resistor 252. The noninverting input of that amplifier is coupled to the wiper arm of a potentiometer 254 having its resistance element coupled between the positive potential source +V and circuit ground. The output of amplifier 250 is coupled to the base of a transistor 256 having its collector coupled to positive potential source +V and its emitter coupled through a resistor 258 to ground. A diode 260 is provided having its cathode coupled to the output of operational amplifier 250 and its anode coupled to circuit ground. The emitter of transistor 256 is coupled through a resistor 262 to the gate of a triac 264. The first main terminal of triac 264 is coupled to ground, and the second main terminal is coupled to a first terminal of the winding of seventh relay 62. The second terminal of that winding is connected to the alternating potential source VAC. The series combination of two variable resistors 266 and 268 is coupled between the noninverting input of operational amplifier 250 and ground.

The operation of the analyzer of FIG. 1 will now be described by stating what happens when an operator tests a battery thereon. The operator first attaches the battery to be tested to circuit points A and B, sets switch 120 to the position corresponding to the cold cranking rating of that battery, and applies power to the analyzer by closing switch 18. If the operator should inadvertently reverse the connections to the battery so that it is coupled to the analyzer with the wrong polarity, current from the battery will flow through diode 136 (FIG. 1b) and actuate relay 30 (FIG. 1b), thus closing contacts 30-2 (FIG. 1a) and illuminating lamp 52 through the circuit including those contacts and normally closed switch 20. Illumination of lamp 52 indicates to the operator that the polarity of the battery should be reversed. When the battery is correctly polarized, the operator starts the testing operation by temporarily depressing normally open switch 26, thus actuating relay 34 through the circuit of contacts 38-1, 30-1, and 32-1. It should be noted that if the operator ignores the reverse polarity indication given by lamp 52 and depresses switch 26 despite that lamp being illuminated, the analyzer will still not commence the testing operation because the normally closed contacts 30-1 will be open. When relay 34 is actuated, contacts 34-1 are closed so that the relay will remain actuated even after switch 26 released and returns to its normally open position; and contacts 34-2 are closed thereby coupling line 36 to one side of the power source 12. Energizing line 36 has at least three effects: (1) It causes current to flow in the circuit of contacts 28-2 and 42-1 to illuminate lamp 44, which indicates to the operator that a test is in progress; (2) it causes relay 38 to be actuated; and (3) it causes current to flow through the contacts 32-2 to the time delay relays 28 and 40. Actuation of relay 38 closes contacts 38-1, insuring that line 36 will remain energized even when relay 34 is subsequently released.

As mentioned, depression of switch 26 actuates relay 34. This closes contacts 34-2 (FIG. 1b) which commences the cold cranking power test. When contacts 34-2 are closed, current from the battery 10 flows through the winding of relay 66 actuating that relay, closing contacts 66-1, and placing the load, including resistors 72, the selected ones of resistors 74 and 78, and the variable resistance network, across the battery 10. As previously described, armature 132 of switch 120 selects which one of resistors 74 and 78 are included in the load. Armature 122 of switch 120 selects the load current level which the circuit will operate to maintain by selecting the potential applied to the inverting input of amplifier 176.

Time delay relay 28 is effective to control the length of the cold cranking power test. When that relay times out, contacts 28-1 (FIG. 1a) open, thus releasing relay 34, opening contacts 34-2, releasing relay 66, opening contacts 66-1, and disconnecting the load from battery 10. While the cold cranking power test is in progress, multiplier 146 is effective to develop at its output a signal proportional to the product of the terminal voltage of battery 10 and the voltage across resistor 69, the latter voltage being proportional to the current delivered by the battery. Thus, the output of multiplier 146 is proportional to the power supplied by the battery. A potential proportional to the battery cold cranking power specification is developed by the selected one of potentiometers 154, 156, 158, 160, 162, 164, 166, and 168. If the signal at the inverting input of amplifier 150 falls below the potential at the noninverting input, indicating the power being produced by the battery is below the specification, the output of amplifier 150 becomes positive, thus forward biasing the base-emitter junction of transistor 172, causing its emitter-collector circuit to become conductive, and applying a positive potential to the gate of triac 180 causing it to be conductive. First relay 34 is actuated during the cold cranking power test so that contacts 34-3 will be closed and relay 46 will be actuated if the battery fails the cold cranking test.

If first time delay relay 28 times out and relay 46 is not actuated, this means that the battery has passed the cold cranking power test and is an acceptable battery. In this case, contacts 28-2 will open and lamp 44 will be extinguished, indicating to the operator that the test has been completed. Further, contacts 28-3 will close, contacts 46-2 will remain closed since relay 46 has not been actuated, and lamp 48 will be illuminated, indicating to the operator that the battery under test has met its specification and is acceptable. If first time delay relay 28 times out and relay 46 is actuated, this means that the battery has failed the cold cranking power test. Actuation of relay 46 causes contacts 46-4 (FIG. 1e) to close. Time delay relay 40 has a delay slightly shorter than that of time delay relay 28. Thus, if contacts 46-4 are closed at the end of the cold cranking power test, contacts 46-4 will also be closed so that relay 46 will remain locked in an actuated position even after termination of the cold cranking power test and the opening of contacts 34-3. The presence of time delay relay 40 and contacts 40-1 insures that the cold cranking power test circuitry is responsive only to the power being delivered by the battery at the end of the cold cranking power test and, in particular, that relay 46 is not locked in its actuated position if the power being delivered by the battery should temporarily fall below the cold cranking specification sometime during the time period of the cold cranking power test because of some aberration in the discharge characteristics of the battery under test.

If during the cold cranking power test the terminal voltage of the battery should fall below the potential applied to the noninverting input of operational amplifier 194, the output of that amplifier will become positive, thus forward biasing the emitter-base junction of transistor 200, applying a positive potential to the gate of triac 208, and actuating relay 32. Actuation of that relay will (1) open contacts 32-1 (FIG. 1a), thus releasing relay 34 and terminating the cold cranking power test, (2) open contacts 32-2, thus preventing further operation of time delay relays 28 and 40, (3) close contacts 32-4 and illuminate lamp 50, indicating to the operator that the cold cranking power has been terminated due to a low battery voltage condition, (4) close contacts 32-5 (FIG. 1d), thus locking relay 32 in its actuated state since contacts 38-2 were previously closed upon actuation of relay 38, and (5) close contacts 32-3, thus applying current to the winding of time delay relay 42 and commencing the voltage bounce back test as will subsequently become apparent.

Actuation of relay 46 upon failure of the cold cranking power test has the further effect of closing contacts 46-1 so that lamp 44 will remain illuminated during the remaining tests. Further, contacts 46-3 are closed, applying current to the winding of time delay relay 42 and initiating the voltage bounce back test. The delay period of third time delay relay 42 determines the time which must elapse following the termination of the cold cranking power test before the bounce back voltage is measured. The bounce back voltage required to be met is applied to the noninverting input of amplifier 210. When the battery terminal voltage is lower than that value, the output of amplifier 210 is positive, thus forward biasing the base-emitter junction of transistor 216, applying a positive potential to the gate element of triac 224, and actuating relay 60. When time delay relay 42 times out at the end of the period for the voltage bounce back test, contacts 42-2 (FIG. 1a) close. If at that time the battery terminal voltage is high and relay 60 is released, contacts 60-1 will be closed and lamp 54 will be illuminated indicating that the battery is unacceptable. If relay 60 is actuated when time delay relay 42 times out, then one of lamps 56 or 58 will be illuminated depending on the state of relay 62 in the battery resistance measuring circuit.

The resistance measuring circuit 230 develops between its outputs a potential proportional to the dynamic internal conductance of the battery 10 and inversely proportional to the dynamic internal resistance of that battery, which potential is amplified by instrumentation amplifier 232 and applied to the inverting input of amplifier 250. The voltage applied to the noninverting input of amplifier 250 corresponds to the maximum acceptable dynamic internal resistance of the battery. If the signal at the inverting input of amplifier 250 is greater than the voltage at the noninverting input thereof indicating that the battery resistance is above the maximum value, the output of amplifier 250 is positive forward biasing the emitter-base junction of transistor 256 causing triac 264 to be conductive and actuating relay 62. If the battery resistance is below the maximum value, relay 62 is released. If relay 62 is released at the end of the voltage bounce back test and relay 60 is actuated, contacts 62-1 will be closed illuminating lamp 56 signalling the operator that the battery is acceptable but merely needs to be recharged. If relay 62 is actuated at the end of the voltage bounce back and relay 60 is released, contacts 62-2 will be closed illuminating lamp 58 and informing the operator that the battery be recharged and retested.

As is well known, the performance of lead-acid batteries is heavily dependent on the temperature of the battery. For example, a given battery at a given state of charge can deliver a set current without the terminal voltage falling below a predetermined value for a much longer period of time at 70° Farenheit than it can at 0° Farenheit. A practical battery analyzer for use under normal automobile servicing conditions must be able to test batteries over a wide range of temperatures. It is thus important that the necessary parameters of the battery analyzer be adjusted to compensate for the temperature of the battery under test. In the analyzer of FIG. 1 the variable resistance networks coupled to the noninverting inputs of amplifiers 150 (FIG. 1c), 210 (FIG 1d), and 250 (FIG. 1e) perform this function. The variable resistance network associated with each of those amplifiers determines the potential level at the amplifier's inverting input which will cause the relay coupled to its output to be actuated. In particular, variable resistors 184, 228, and 268 may be used to calibrate the analyzer of FIG. 1, to insure that the potential levels applied to their respective amplifier inputs are correct at some fixed temperature, such as 20° Farenheit and with the associated variable resistors 182, 226, and 266 at some fixed position of adjustment. Variable resistors 182, 226, and 266 may then be used to compensate for changes in the battery temperature through manual adjustment by the operator. The adjustment position of those variable resistors should preferably be calibrated in battery temperature degrees. It is also possible to include within the analyzer apparatus for sensing the battery temperature and automatically performing the adjustments done manually in the analyzer of FIG. 1 with variable resistor 182, 226, and 266.

As mentioned, the circuit of FIGS. 1b and 1c for performing the cold cranking power test includes a multiplier 146 for developing a signal proportional to the power being delivered by the battery under test. The presence of such a circuit is advantageous in cases where it is desired to obtain a measurement of that power since a suitably calibrated meter coupled between the output of multiplier 146 and ground would give just such a reading. Such a measurement is useful in cases where the circuitry of FIG. 1b is for some reason incapable of maintaining the current drawn from the battery at the desired constant current. However, in most cases the circuitry of FIG. 1b will be effective to maintain the battery current acceptably close to that desired. In such cases the circuitry for measuring the battery cold cranking power need be responsive only to the battery terminal voltage. Multiplier 146 may then be omitted and the inverting output of amplifier 140 can be coupled directly to resistor 148.

In one apparatus constructed according to the circuitry of FIG. 1, the first, second, and third time delay relays 28, 40, and 42 had delay periods of 20, 19.5, and 15 seconds, respectively, multiplier 146 was a Burr-Brown model 4203, resistance meter 230 was a Motorola model 8TE-2003 with the outputs thereof being taken from the meter terminals, and the instrumentation amplifier was a Burr-Brown 3625. The Burr-Brown models 4203 and 3625 are available from Burr-Brown Research Corporation, International Airport Industrial Park, Tucson, Ariz. 85734. The Motorola model 8TE-2003 is available from Motorola Inc., Automotive Products Division, 9401 West Grand Ave., Franklin Park, Ill. 60131.

In the circuit of FIG. 1 the last test performed is a measurement of the internal circuit parameter of the battery measured by the Motorola model 8TE-2003. This unit is said to measure the inverse dynamic internal resistance or the dynamic internal conductance of the battery and it has been so described herein. It may be desirable in some applications of this invention to replace that test with one that measures the actual dynamic internal resistance or conductance or the internal capacitance, the capacitive reactance, or some other appropriate circuit parameter of the battery.

FIG. 2 of the drawing discloses an alternative embodiment of this invention which includes circuitry for automatically performing the temperature correction function discussed above with respect to FIG. 1. The FIG. 2 embodiment is also completely solid state and uses a minimum number of electromechanical relays. The construction of the circuitry of FIG. 2 will be described along with a description of its operation. As with FIG. 1, the circuitry of FIG. 2 is shown in eight separate figures, FIGS. 2a–2h, for ease of drawing. A number of circuit points are labeled with mnemonics representing the signal at that circuit point. The convention that circuit points having the same mnemonic are connected together is used and in FIGS. 2e and 2f circuit points bearing the same letter designations are also coupled together. A positive logic convention will be used with logic level 1 (LL1) being a positive potential with respect to circuit ground and logic level 0 (LL0) being a ground level (or negative) potential.

To operate the tester of FIG. 2, the positive and negative terminals of the battery under test are first coupled to the circuit points BAT+ and BAT− (FIG. 2a), respectively. Circuit point BAT+ is separately connected to inputs of six differential amplifiers 300, 302, 304, 306, 308 and 310 through resistors 312, 314, 316, 318, and 322 as shown in FIG. 2a. The inputs of differential amplifiers 300–310 are appropriately connected to circuit ground or various potentials to compare the battery terminal voltage to other potential levels. Amplifier 300 immediately detects whether the polarity of the connections from the battery to the tester has been reversed and, if so, a LL1 signal at its output is applied through an OR gate 322 and a driver 324 to immediately illuminate "REV" lamp 326 indicating the existence of a polarity reversal to the operator. Amplifiers 302, 304, 306, 308 and 310 monitor whether the battery terminal potential is greater than eleven volts, less than eight volts, greater than three volts, less than the reference potential KWREF established for the cold cranking power test, and less than the reference potential BBREF established for the voltage bounce back test, respectively. The output of amplifier 302 is connected through an inverter 328 (FIG. 2b) to an input of an AND gate 330 having its other input coupled to the output of amplifier 306. Thus, the output of gate 330 is at LL1 when the battery potential is between three and eleven volts indicating that the battery potential is excessively low and it should not be tested. The output of gate 330 is coupled through a transmission gate 332, an OR gate 333, and a driver 334 to LOVO lamp 336 to illuminate that lamp prior to the commencement of the battery test procedure and indicate to the operator that the battery potential is excessively low and the battery test procedure should not be initiated. In the event the battery terminal voltage is below three volts prior to the commencement of the test procedure, the apparatus of FIG. 2 simply does not respond to it.

As soon as the battery is connected to the tester of FIG. 2, the tester circuitry commences generating the reference potentials for the cold cranking power and voltage bounce back tests. The temperature transducer circuitry is shown in FIG. 2c. That circuitry includes a differential amplifier 340 used essentially as a source for applying a constant current to a diode 342 located in the temperature sensor shown in FIGS. 3a and 3b. The sensor is a part of the connector attached to the negative terminal of the battery under test so that diode 342 is in thermal contact with the negative terminal and the voltage across the diode varies according to the battery temperature. Amplifier 344 senses the voltage across the diode 340 and generates at its output a signal proportional to the temperature of the battery under test. The noninverting input of amplifier 340 is coupled through a resistor 346 to the junction of the series combination of a resistor 348 and a zener diode 350 coupled between a first positive potential source +V1 and ground to form a second positive potential source +V2. The output of amplifier 340 is coupled both to the inverting input thereof through a resistor 352 and to the anode of diode 342 through a resistor 354. That anode is also coupled to the noninverting input of amplifier 340 through a resistor 356 and to the inverting input of amplifier 344 through a resistor 358. The cathode of diode 342 is coupled to ground. The noninverting input of amplifier 344 is coupled through a resistor 360 to ground and through a resistor 362 to the tap of a potentiometer 364 having one end coupled to ground and the other end connected through a resistor 366 to the second positive potential source +V2 previously mentioned. The parallel combination of a diode 368, a resistor 370, and a capacitor 372 are coupled as a feedback network between the output of amplifier 344 and the inverting input thereof as shown.

Figure 2A:
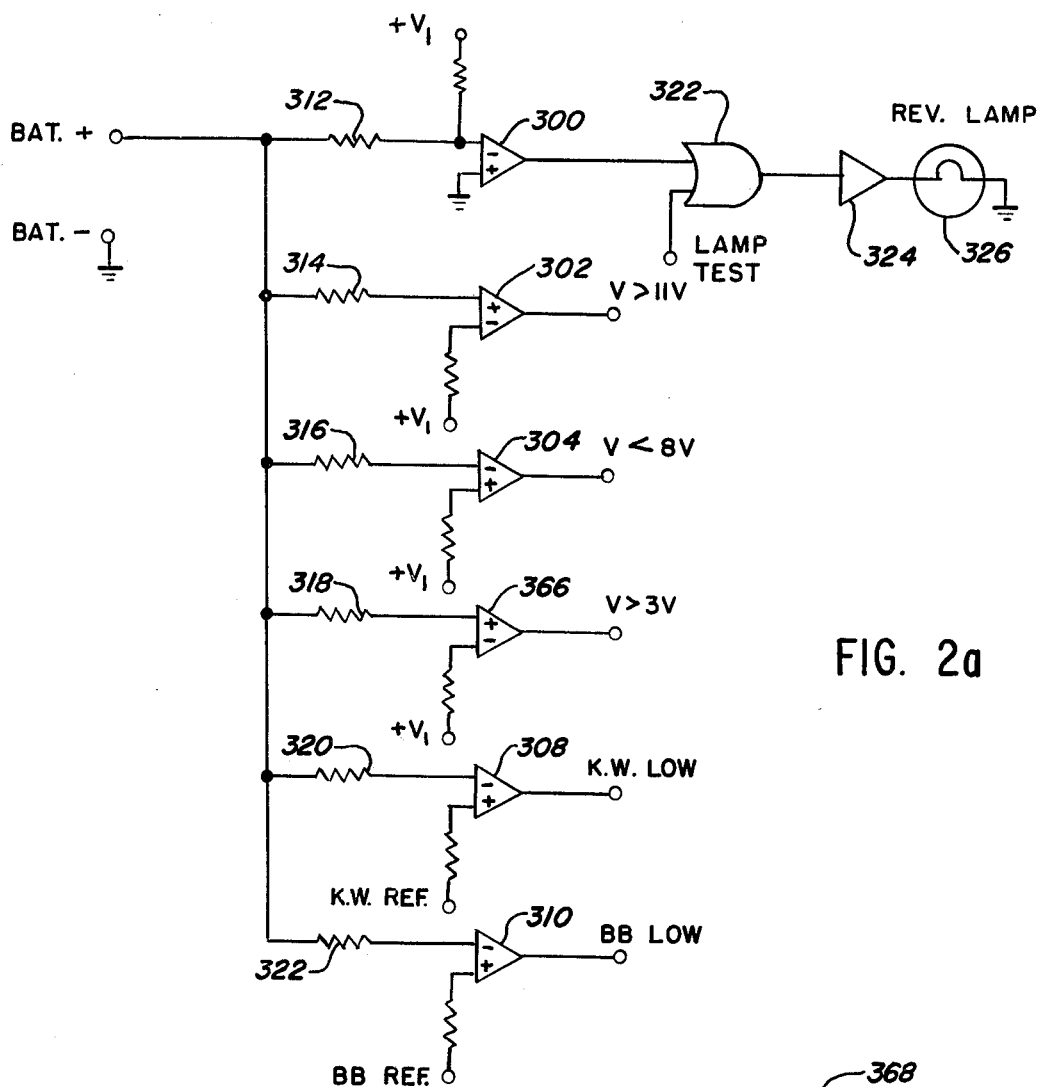
FIG. 2 is divided into FIGS. 2a–2h which disclose a second automatic battery analyzer making use of this invention.
Figure 2C:
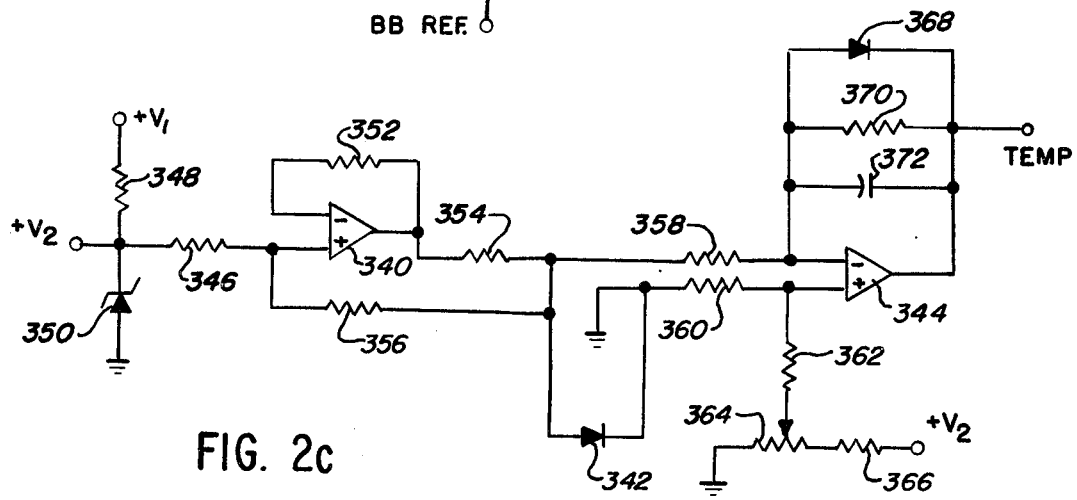
Figure 2B:
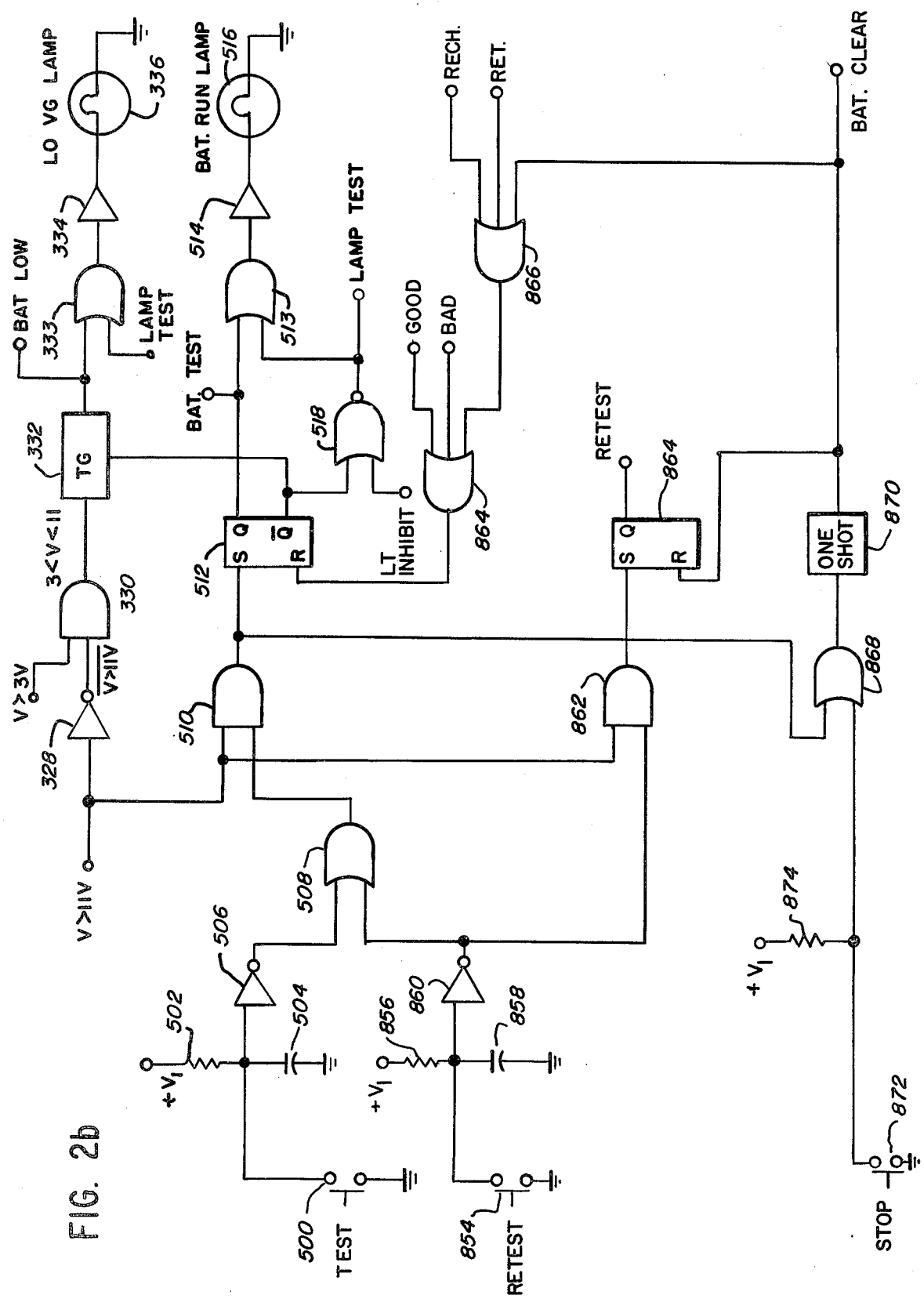
Figure 2D:
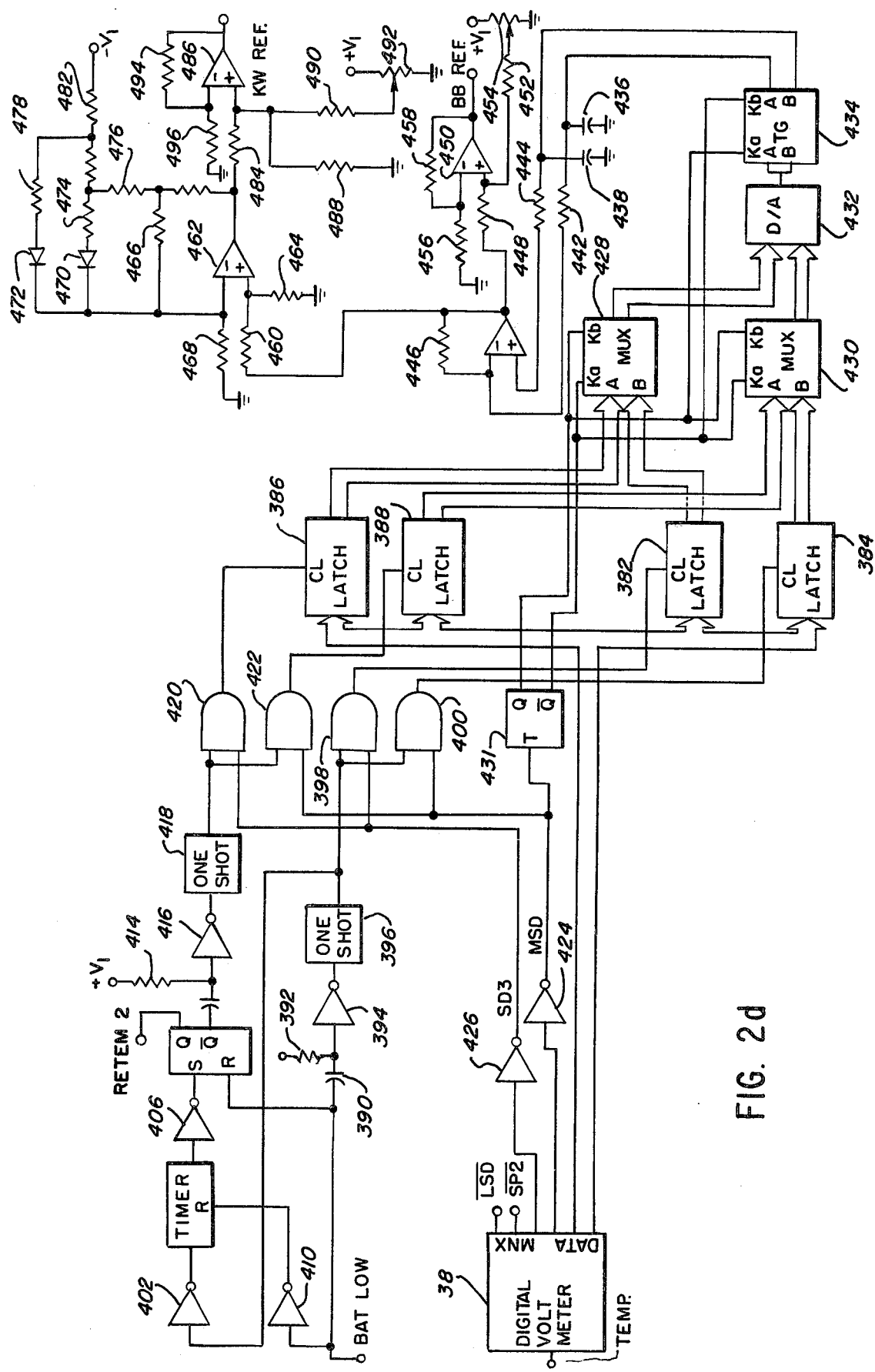
Figure 2E:
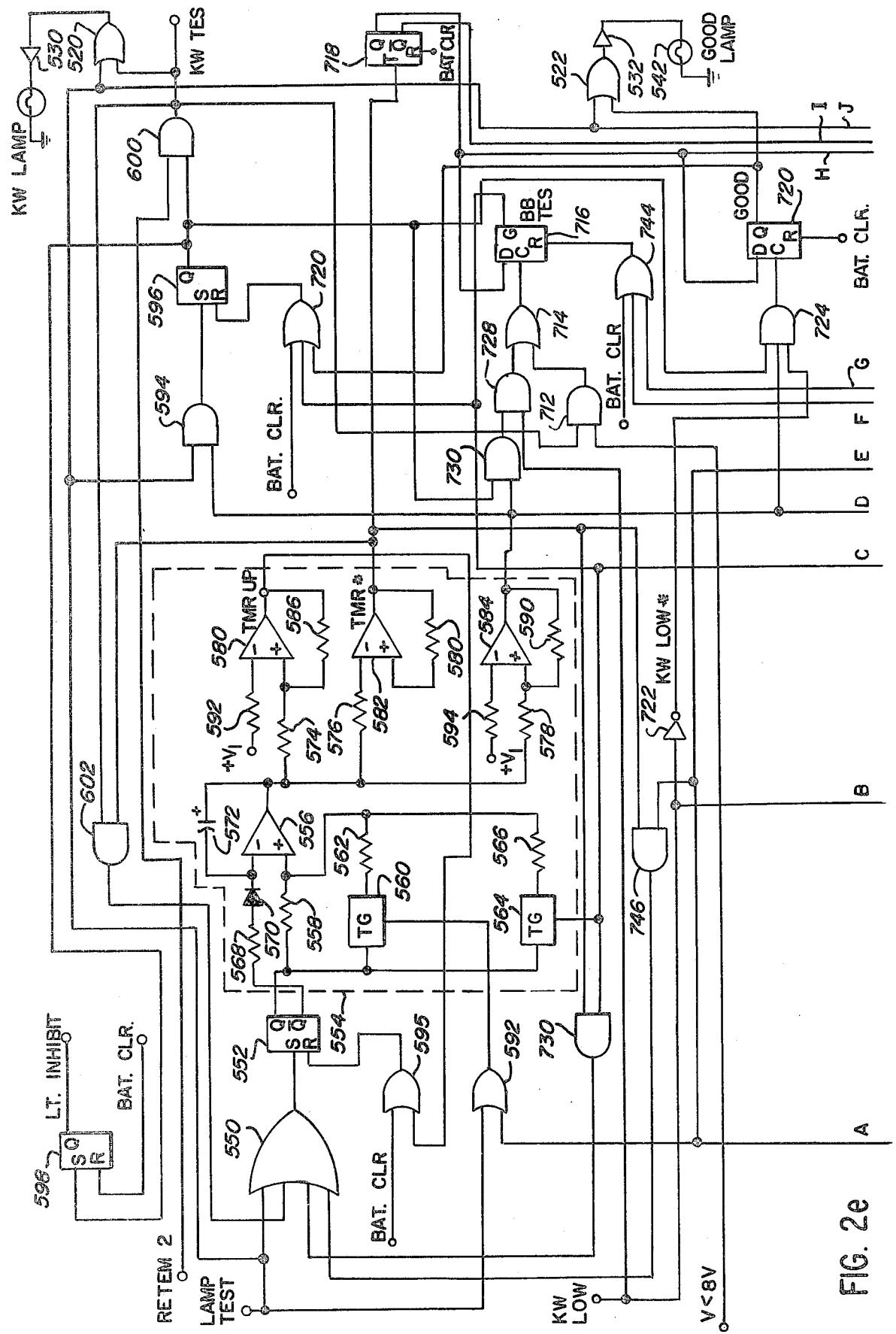
Figure 2F:
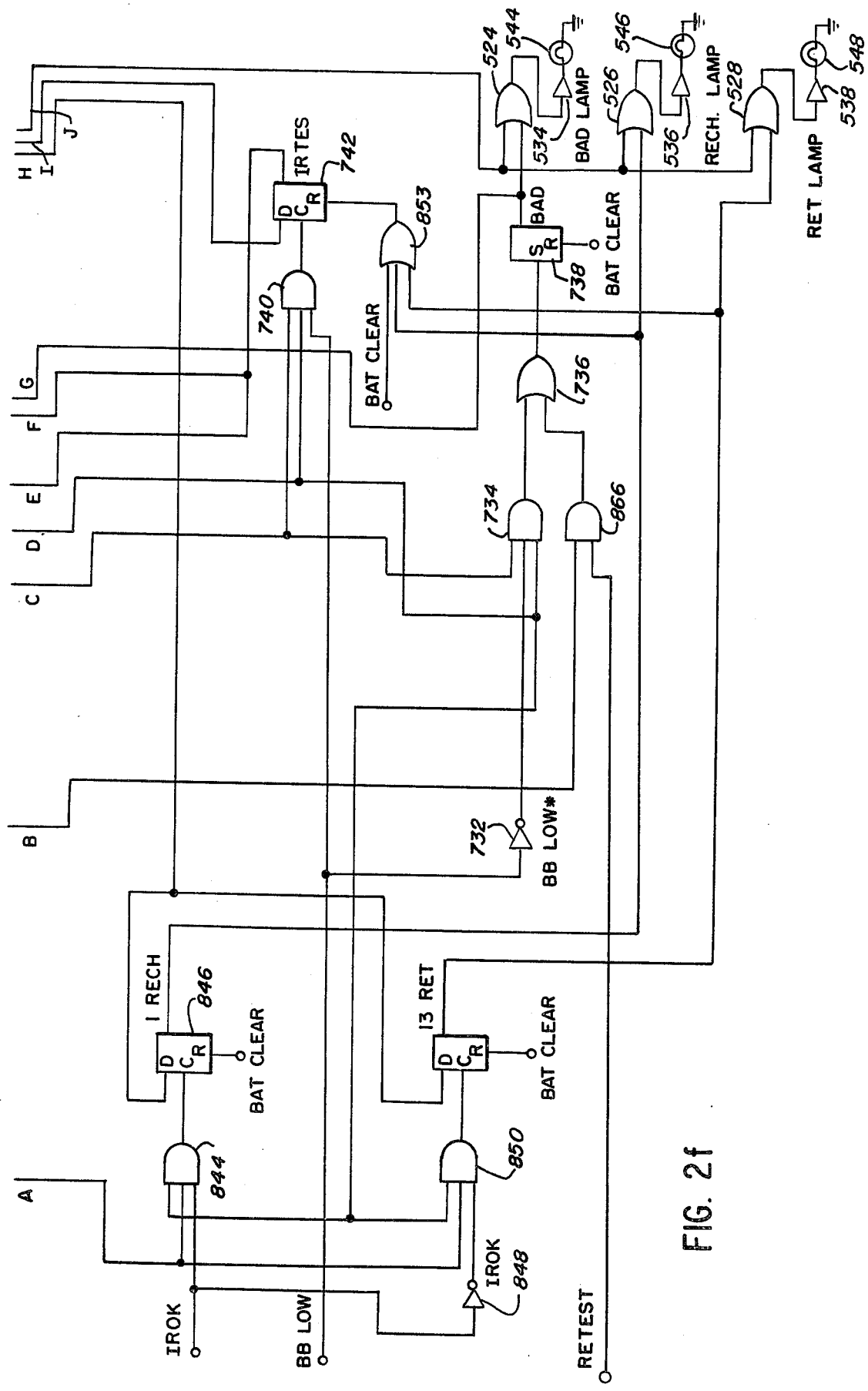

In FIG. 2d there is disclosed the circuitry for converting the signal at the output of amplifier 344 representative of the battery negative terminal temperature to the reference potentials for the cold cranking power and voltage bounce back tests. The temperature sensing diode 342 is initially at the ambient temperature and when placed in thermal contact with the negative battery terminal its temperature changes toward that of the terminal. It has been empirically determined that the change in the temperature of diode 342 which occurs in the first five seconds following the time it is placed in thermal contact with the battery negative terminal is approximately one-fourth of the difference between the initial measured temperature and the actual battery temperature. The circuitry of FIG. 2d is operative to measure the temperature of diode 342 at the instant it is placed in contact with the battery negative terminal and five seconds later, to subtract three times the first reading from four times the second reading to obtain a signal representing an approximation of the battery temperature, and to derive from the last mentioned signal the desired reference potentials.

The output of amplifier 344 (FIG. 2c) is applied to the input of an analog-to-digital converter 380 (FIG. 2d) which in this case comprises a digital voltmeter. The converter 380 has a four-line multiplexed data output which at any time represents in binary form one of four decimal digits corresponding to the potential present at the input thereof. The converter 380 also has four multiplex outputs which at any time have a LL0 signal on the end of those outputs corresponding to the one of the decimal digits then present at the data outputs. The data outputs of converter 380 are applied to the data inputs of four four-bit data latch circuits 382, 284, 386 and 388. In order to clock the data latch circuits, the output of transmission gate 332 (FIG. 2b) is applied through a pulse forming circuit comprising capacitor 390 and resistor 392 and an inverter 394 to the input of a single shot multivibrator 396. The output of multivibrator 396 is coupled to inputs of AND gates 398 and 400 and through an inverter 402 to the input of a timer 404 providing a five-second delay. The output of timer 404 is coupled through an inverter 406 to the set input of a set-reset flip-flop 408. The output of transmission gate 332 is also coupled to the reset input of flip-flop 408 and through an inverter 410 to the reset input of timer 404. The $\overline{Q}$ output of flip-flop 408 is coupled through a pulse forming circuit comprising capacitor 412 and resistor 414 and an inverter 416 to the input of a single shot multivibrator 418. The output of multivibrator 418 is coupled to inputs of AND gates 420 and 422. Only the two most significant digits in the data output of converter 380 are used in the circuit of FIG. 2d. The multiplex output of converter 380 representing the most significant digit is coupled through an inverter 424 to inputs of AND gates 400 and 422 and the multiplex output of converter 380 representing the third most significant digit is coupled through an inverter 426 to inputs of AND gates 398 and 420. The outputs of AND gates 398, 400, 420 and 422 are coupled to the clock inputs of latch circuits 382, 384, 386 and 388, respectively.

As will be apparent, when the testing apparatus is initially connected to the battery under test and if the battery potential is above 11 volts, the output of transmission gate 332 (FIG. 2b) will go to LL0 causing single shot multivibrator 396 to be actuated thus gating the multiplex outputs of converter 380 for the two most significant bits through AND gates 398 and 400 to the clock inputs of data latches 382 and 384 and placing signals representing the two most significant digits of the temperature of diode 342 into those two latches. Operation of the multivibrator 396 also commences operation of the timer 404 which after a five second delay sets the set-reset flip-flop 408 and causes single-shot multivibrator 418 to be actuated thus gating the multiplex outputs of converter 380 for the two most significant digits through AND gates 420 and 422 to the clock inputs of data latches 386 and 388 and placing signals representing the two most significant digits of the temperature of diode 342 into those two latches.

The outputs of latches 382 and 384 are coupled to the B inputs of quad two input multiplexers 428 and 430, respectively, while the outputs of latches 386 and 388, respectively, are coupled to the A inputs of the same multiplexers. The toggle input of a toggle flip-flop 431 is coupled to the output of inverter 424 and the Q and $\overline{Q}$ outputs of that flip-flop are coupled to the input B and input A select lines, respectively, of multiplexers 428 and 430. The outputs of the two multiplexers are coupled to a digital-to-analog converter 432, the output of which is coupled to both inputs of a two-channel transmission gate 234. The channel A and B control inputs of transmission gate 434 are coupled to the Q and $\overline{Q}$ outputs, respectively, of flip-flop 431. As will be apparent, transmission gate 434 will develop at its outputs A and B analog signals at potentials responsive to the temperature of diode 342 at the time the testing apparatus is first connected to the negative terminal of the battery under test and the time five seconds later, respectively. The outputs A and B of transmission gate 434 are each coupled to ground through filter capacitors 436 and 438 and to the inverting and noninverting inputs of an operational amplifier 440 through resistors 442 and 444, respectively. Amplifier 440 has a feedback resistor 446 coupled between the output and the inverting input thereof. The relative values of resistors 442, 444 and 446 are selected so that the output of amplifier 440 is at a potential proportional to four times the potential at output B of transmission gate 434 minus three times the potential at output A thereof.

In order to generate the voltage bounce back reference potential, the output of amplifier 440 is coupled through a resistor 448 to the noninverting input of a differential amplifier 450. That input is also coupled through a resistor 452 to the tap or a potentiometer 454 having its resistance element coupled between positive potential source +V1 and circuit ground. The inverting input of that amplifier is coupled to ground through a resistor 456 and the output thereof is coupled to the inverting input through a resistor 458. The reference potential for the voltage bounce back test is present at the output of amplifier 450.

In order to generate the cold cranking power reference potential, the output of amplifier 440 is coupled through a resistor 460 to the noninverting input of a differential amplifier 462. That input is also coupled to ground through a resistor 464. The output of amplifier 462 is coupled to the inverting input thereof through a resistor 466, which input is also coupled to ground through a resistor 468. The inverting input of amplifier 468 is also coupled to the cathodes of diodes 470 and 472. The anode of diode 470 is coupled through the series combination of resistors 474 and 476 to the output of amplifier 462 and the anode of diode 472 is coupled through the series combination of resistors 478 and 480 to the junction of resistors 474 and 476. The junction of resistors 478 and 480 is coupled through a resistor 482 to a first negative potential source −V1. The output of amplifier 462 is also coupled through a resistor 484 to the noninverting input of a differential operational amplifier 486, which input is also coupled through a resistor 488 to ground and through a resistor 490 to the tap on a potentiometer 492 having its resistance element coupled between the positive potential source +V1 and ground. The output of amplifier 486 is coupled to the inverting input thereof through a resistor 494 and that inverting input is coupled to ground through a resistor 496. The cold cranking power reference potential is developed at the output of amplifier 486.

The presence of a LL1 signal at the Q output of flip-flop 408 is used as an indication that the circuitry of FIG. 2d has completed making the second temperature reading and that the cold cranking power and bounce back reference potentials have been determined. In one apparatus constructed according to this invention, the following components had the indicated circuit values:

| 346 | 1 megohm | 436 | 1μfd. | 466 | 765 kohm |
|---|---|---|---|---|---|
| 348 | 2.7 kohm | 438 | 1μfd. | 468 | 33 kohm |
| 352 | 510 kohm | 442 | 33.2 kohm | 474 | 1.1 megohm |
| 354 | 5.1 kohm | 444 | 24.9 kohm | 476 | 4.12 kohm |
| 356 | 510 kohm | 446 | 100 kohm | 478 | 1.24 kohm |
| 358 | 200 kohm | 448 | 100 kohm | 480 | 2.2 kohm |
| 360 | 200 kohm | 452 | 100 kohm | 482 | 12.8 kohm |
| 362 | 1 megohm | 454 | 10 kohm | 484 | 210 kohm |
| 364 | 10 kohm | 456 | 100 kohm | 488 | 33.2 kohm |
| 366 | 10 kohm | 458 | 100 kohm | 490 | 43.2 kohm |
| 370 | 1 megohm | 460 | 33 kohm | 492 | 10 kohm |
| 372 | 0.1 pfd | 464 | 620 kohm | 494 | 33.2 kohm |
|   |   |   |   | 496 | 33.2 kohm |

In that same apparatus, diodes 342, 470, and 472 were diodes sold under the type number 1N4148, zenar diode 350 was a diode sold under the type number 1N4740A, the first positive and negative and second positive potential sources +V1, −V1, and +V2 were +15 volts, and −15 volts, and +10 volts with respect to circuit ground, respectively, the converter 380 was a digital voltmeter sold by Integrated Photomatrix Inc. of Mountainside, N.J., under the type number MC904, and the potential at the output of amplifier 344 varied by 10 millivolts per centigrade degree with zero volts being at −18 degrees centigrade.

When the operator desires to commence the battery test, he momentarily closes the normally open switch 500 (FIG. 2b) which is coupled between circuit ground and a pulse-forming circuit of a resistor 502 and capacitor 504 and through an inverter 506, OR gate 508, and AND gate 510 to the set input of a set-reset flip-flop 512. Closing switch 500 thus applies a LL1 pulse to the set input of flip-flop 512 placing its Q output and the BATES signal at LL1. The Q output of flip-flop 512 is coupled through an OR gate 513 and driver 514 to a lamp 516 to illuminate that lamp and indicate the battery test procedure is running. The AND gate 510 has another input coupled to the output of amplifier 302 (FIG. 2a) and insures that the battery test procedure cannot commence if the battery terminal voltage is less than 11 volts. The $\overline{Q}$ output of flip-flop 512 is coupled to the control input of transmission gate 332 to insure that the lamp 336 is responsive to low battery terminal voltage only prior to the commencement of the test procedure. The $\overline{Q}$ output of flip-flop 512 is also coupled to an input of a NOR gate 518; the output of gate 518 and the LAMPTEST signal are placed at LL1 when flip-flop 512 is reset. When the LAMPTEST signal is at LL1, all of the display lamps for the battery analyzer are illuminated simultaneously so that the operator may determine that they are all operative. To achieve this, the output of NOR gate 518 is coupled to inputs of OR gate 333 and 513 to illuminate the LOVO and BATRUN lamps 336 and 516, respectively, and to inputs of OR gates 520 (FIG. 2e) 522 (FIG. 2e), 524 (FIG. 2f), 526 (FIG. 2f) and 528 (FIG. 2f), which OR gates have their outputs individually coupled through a driver 530, 532, 534, 536 and 538 to KW, GOOD, BAD, REC and RET lamps 540, 542, 544, 546 and 548, respectively. As will become clear subsequently, illumination of those lamps during the test procedure indicates to the operator, respectively, that the cold cranking power test is being performed and that the battery is acceptable, is not acceptable, is acceptable but needs to be recharged, or needs to be recharged and retested.

The output of gate 518 is also applied through an OR gate 550 (FIG. 2e) to the set input of a set-reset flip-flop 552. The Q and $\overline{Q}$ outputs of that flip-flop are coupled to inputs of a timer circuit 554 including the components shown within the dashed lines in FIG. 2e. The Q output of flip-flop 552 is coupled to the noninverting input of an amplifier 556 through a resistor 558, through the first series combination of a transmission gate 560 and a resistor 562, and through the second series combination of a transmission gate 564 and a resistor 566. The $\overline{Q}$ output of flip-flop 552 is coupled through a resistor 568 to the anode of a diode 570 having its cathode coupled to the inverting input of amplifier 556. A timing capacitor 572 is coupled between the output of that amplifier and its inverting input. The output of that amplifier is also coupled through resistors 574, 576 and 578 to the noninverting, inverting and noninverting inputs of amplifiers 580, 582 and 584, respectively. Feedback resistors 586, 588 and 590 are provided for those amplifiers coupled between their outputs and the noninverting inputs. The inverting inputs of amplifiers 580 and 584 are coupled to the positive potential source +V1 through resistors 592 and 594, respectively. When flip-flop 552 is reset, the TMRUP and STATUS signals at the outputs of amplifiers 580 and 584 will be at LL0 and the output of amplifier 582 will be at LL1. When flip-flop 552 is set, the outputs of amplifiers 580, 582 and 584 will all change logic levels after a predetermined time period and remain at those new logic levels until the flip-flop 552 is again reset. The length of that predetermined period is determined by the relative values of the input resistance to amplifier 556 and the capacitor 572, the magnitude of that input resistance in turn being controlled by the states of conductivity of transmission gates 560 and 564. The relative values of resistors 574 and 598 are selected so that the output of amplifier 584 will change from LL0 to LL1 shortly before the output of amplifier 580 will do so. The output of amplifier 580 is coupled through an OR gate 595 to the reset input of flip-flop 552 to reset the flip when the timer 554 times out. Resistor 568 insures that the timer will not return to its initial state immediately after flip-flop 552 is reset.

The time period required for the lamp test is short compared to that required for the cold cranking power and voltage bounce back tests. Accordingly, the LAMPTEST signal is coupled from the output of NOR gate 518 through OR gate 592 to the control input of transmission gate 560 to place resistor 562 which has a resistance significantly less than that of resistors 558 and 566 in the input circuit to amplifier 556. To terminate the lamp test, the output of amplifier 584 is coupled through one input of an AND gate 594 to the set input of a set-reset flip-flop 596 having its Q output coupled to the set input of another set-reset flip-flop 598. While the lamp test is in progress, when the output of amplifier 584 goes to LL1, the Q outputs of both flip-flops 596 and 598 go to LL1. The output of 598 is used to inhibit the lamp test by coupling the LTINHIBIT signal at its output to the second input NOR gate 518 (FIG. 2b) and returning the output of that gate and the LAMPTEST signal to LL0.

The Q output of flip-flop 596 is additionally coupled to an input of AND gate 600, which gate generates the signal KWTES at its output which when it is at LL1 indicates that the cold cranking power test is in progress. The second input of gate 600 is coupled to the output of flip-flop 408 (FIG. 2d) to insure that the cold cranking power test will not commence until after the reference potential therefor has been fully determined. The output of gate 600 is also coupled to an input of OR gate 550 through an AND gate 602 having its other input coupled to the output of amplifier 582 to recommence operation of the timer 554. In this case the period of the timer is relatively long since its input resistance is determined wholly by resistor 558.

Figure 2G:
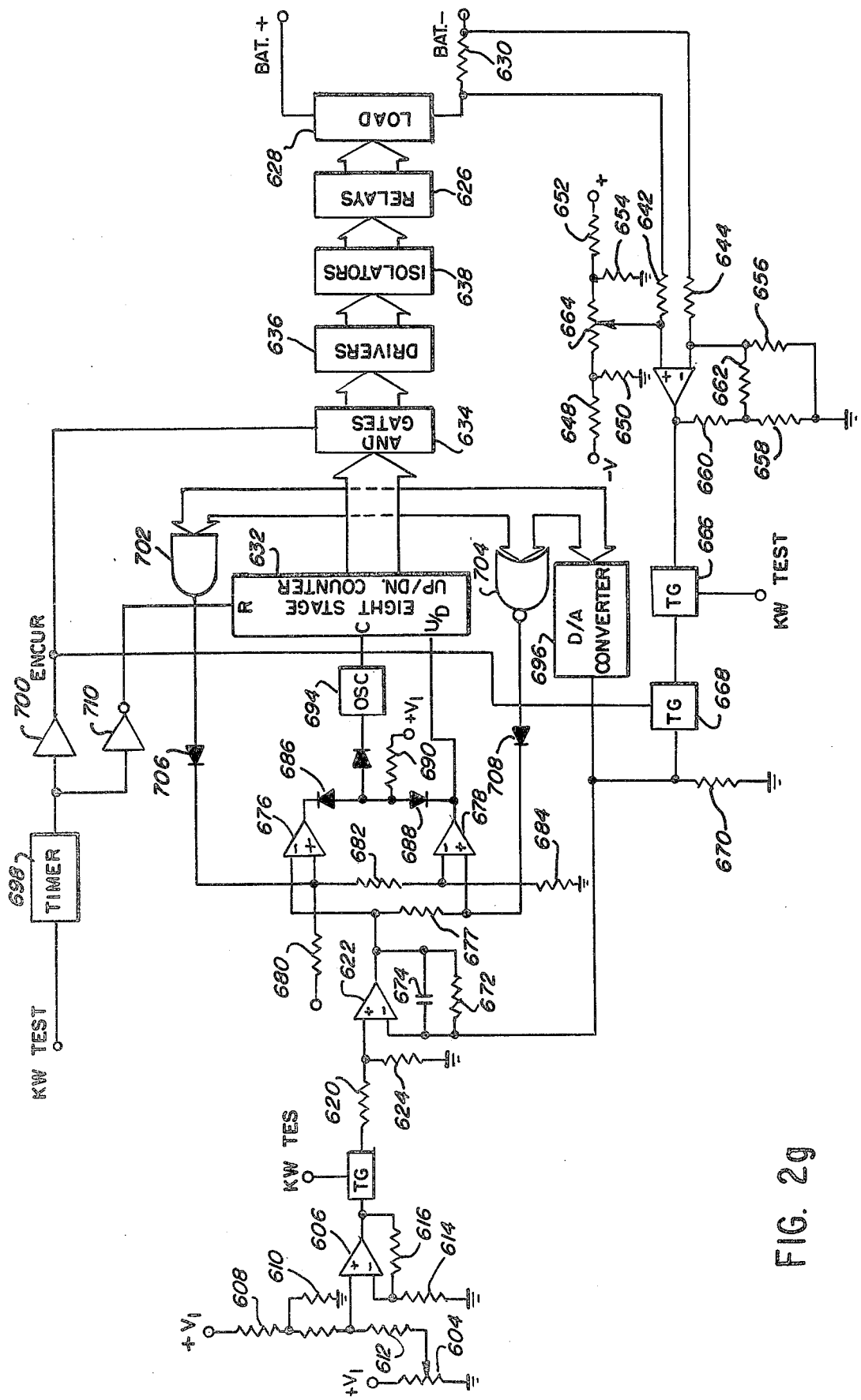

The circuitry for performing the cold cranking power test is shown in FIG. 2g. When the KWTES signal is at LL1, a potential proportional to that developed by a potentiometer 604 is applied through a differential amplifier 606 with its appropriate bias and feedback network of resistors 608, 610, 612, 614 and 616, a transmission gate 618, and a resistor 620 to the noninverting input of differential amplifier 622. Potentiometer 604, like the switches 122 and 128 of the FIG. 1 embodiment, is set in accord with the cold cranking power rating of the battery under test. The noninverting input of amplifier 622 is also coupled to ground through a resistor 624.

The circuitry of FIG. 2g includes a set of seven relays 626 with each one of those relays controlling the application of an individual load resistor included within load 628 across the battery under test. The resistances of the resistors within load 628 are binarily related. One side of load 628 is coupled to the positive terminal of the battery under test and the other side is coupled to the negative terminal of that battery through a shunt resistor 630. An eight-stage up/down counter 632 is provided to control the operation of relays 626, with each of the outputs thereof being coupled to the corresponding one of relays 626 through a set of AND gates 634, a set of drivers 636, and a set of optical isolators 638. A differential amplifier 640 has its inputs coupled across the shunt resistor 630 through resistors 642 and 644 and has an associated bias and feedback network including resistors 648, 650, 652, 654, 656, 658, 660 and 662 and potentiometer 664 connected as shown. The output of amplifier 640 is coupled through the series connection of transmission gates 666 and 668 to the inverting input of amplifier 620. A resistor 670 is coupled from that same input to ground and a resistor 672 and a capacitor 674 are coupled in parallel between the output of that amplifier and its inverting input. The output of amplifier 622 is coupled to the inverting input of a differential amplifier 676 and through a resistor 677 to the noninverting input of a differential amplifier 678. A potential divider of three series connected resistors 680, 682 and 684 is coupled between the positive potential source +V1 and circuit ground with the noninverting input of amplifier 676 being coupled to the junction of resistors 680 and 682 and the inverting input of amplifier 678 being coupled to the junction of resistors 682 and 684. The output of each of amplifiers 676 and 678 is coupled to the cathode of a diode 686 and 688, respectively. The anodes of those diodes are coupled together and their junction is coupled to the potential source +V1 through a resistor 690 and to the anode of a diode 692 having its cathode coupled to a disabling input of an oscillator 694. Oscillator 694 is such that when a LL0 signal is present at its disabling input a series of LL1 pulses is produced at the output thereof, but when a LL1 signal is present at its control input no such series of pulses is produced. The output of oscillator 694 is coupled to the clock input of counter 632 and the output of amplifier 678 is coupled to the up/down control input of counter 632. Counter 632 is such that when a LL1 signal is present at its control input, it counts up and otherwise it counts down.

Circuitry is further provided to set counter 632 at approximately the count required to maintain the desired load current from the battery under test prior to placing the load on the battery. That circuitry includes a digital-to-analog converter 696 coupled from the outputs of counter 632 to the inverting input of amplifier 622. The KWTES signal is coupled from the output of gate 600 (FIG. 2e) to the control input of a timer 698. The output of timer 698 is at LL0 until the expiration of a predetermined time after the KWTES signal goes to LL1 at which time the timer output goes to LL1 and stays there until the KWTES signal returns to LL0. The output of timer 698 is coupled through a driver 700 to the inputs of AND gates 634 so that the relays 626 are effectively disabled during the period of timer 642. Further, the output of driver 700 is coupled to the control input of transmission gate 668 so that the only input presented during that period to the inverting input of amplifier 622 is from the output of digital-to-analog converter 696. Amplifiers 676 and 678 effectively operate as a window comparator so that when the potential at the output of amplifier 622 is between the potentials established at the two terminals of resistor 682, i.e., that potential is within the window, a LL0 signal is applied to the disabling input of oscillator 694 but otherwise a LL1 signal is applied to that disabling input. Moreover, the output of amplifier 678 is either at LL0 or LL1 depending on whether the output of amplifier 622 is either below or above the potential at the lower terminal of resistor 682 and counter 632 is correspondingly caused to count down or up. The KWTES signal itself is coupled from the output of gate 600 to the control input of transmission gate 666. During the time period provided by timer 698 following the change of the KWTES signal to LL1, oscillator 694 supplies pulses to the clock input of counter 632 causing the count therein to increase from zero up to the value required for the output of amplifier 622 to come within the window of the window comparator at which time oscillator 694 is disabled. Thus, the counter 632 is preset to a value determined by the setting of potentiometer 604 and corresponding to the cold cranking power rating of the battery under test.

When timer 698 times out, the counter 632 is coupled through AND gates 634 to the relays 626 placing the corresponding load across the battery under test. The battery load current flows through the shunt resistor 630 and a potential is developed at the output of amplifier 640 proportional to the magnitude of that current. That potential is coupled through the transmission gates 666 and 668 to the input of amplifier 622. If the difference in the potentials applied to amplifier 622 is such that its output is above or below the window of the window comparator, oscillator 694 is enabled to change the count in counter 632 and thus alter the load. If the load and the load current are too small, then the output of amplifier 622 will be above the window, the output of amplifier 678 will be at LL1, and the count on counter 632 will be increased and the load correspondingly increased until the output of amplifier 622 comes within the window disabling oscillator 694. If the load and the load current are too large, then the output of amplifier 622 will be below the window, the output of amplifier 678 will be at LL0, and the count in counter 632 will be decreased and the load correspondingly decreased again until the output of amplifier 622 comes within the window disabling oscillator 694. An AND gate 702 and a NOR gate 704 are provided having inputs coupled to each of the outputs of counter 632 and outputs coupled to the anodes of diodes 706 and 708, respectively, those diodes having their cathodes coupled to the noninverting inputs of amplifiers 676 and 678, respectively. The gates 702 and 704 insure that if the counter should reach the count where its outputs are all at LL0 or LL1, the counting process will stop in order to avoid undesirably large changes in the battery load and, in particular, to avoid the possibility of placing an undesirably large load on the battery under test due to a circuit malfunction. An inverter 710 is coupled between the output of timer 698 and a reset input of counter 632 which input resets the counter to a count of zero when a positive going pulse is applied thereto. The inverter 710 resets the counter to zero when the cold cranking power test is completed.

Amplifier 304 (FIG. 2a) monitors the battery terminal during the duration of the cold cranking power test. Its output is applied to an input of an AND gate 712

(FIG. 2c) having its other input coupled to the KWTES signal at the output of gate 600. The output of gate 712 is coupled through an OR gate 714 to the clock input of a D-type flip-flop 716. The data input of that flip-flop is coupled to the Q output of a toggle flip-flop 718 having its input coupled to the output of amplifier 582. Flip-flop 718 will be in its set condition during the cold cranking power test, so that if the battery terminal voltage should drop below 8 volts at any time during the test flip-flop 716 will be set causing the BBTES signal at its Q output to go to LL1. That Q output is coupled through an OR gate 720 to the reset input of flip-flop 596 so that the later flip-flop will be reset placing the KWTES signal at the output of gate 600 at LL0 and terminating the cold cranking power test by opening AND gates 634 (FIG. 2g).

Amplifier 308 (FIG. 2a) likewise monitors the battery terminal voltage and produces a LL1 signal when that voltage is below the cold cranking power reference potential. The output of that amplifier is coupled through an inverter 722 (FIG. 2e) to one input of an AND gate 724 having two other inputs coupled to the output of amplifier 584 and the Q output of flip-flop 596. The output of AND gate 724 can go to LL1 only when the battery terminal voltage exceeds the cold cranking power reference potential shortly before the termination of the cold cranking power test, i.e., during the cold cranking power test as indicated by a LL1 signal at the Q output of flip-flop 596 and shortly before its termination in the time period between the transition of the output of amplifier 584 to a LL1 and the resetting of flip-flop 596. The output of gate 724 is coupled to the clock input of a D-type flip-flop 726 having its data input coupled to the Q output of flip-flop 718 which latter output, as mentioned, is at LL1 during the cold cranking power test. Thus, if the battery passes the cold cranking power test, flip-flop 726 is set and the Q output thereof is coupled through OR gate 522 and driver 532 to GOOD lamp 542 illuminating that lamp. The Q output of flip-flop 726 is also coupled through OR gate 720 to reset flip-flop 596 and terminate the cold cranking power test when the battery passes that test.

The output of amplifier 308 (FIG. 2a) is also coupled to an input of an AND gate 728 (FIG. 2e) which has its other input coupled to the output of an AND gate 730 and its output coupled through OR gate 714 to the clock input D-type flip-flop 716. One input of AND gate 730 is coupled to the output of amplifier 584 and the other is coupled to the Q output of flip-flop 596. In a manner similar to that discussed above with respect to gate 724, the output of gate 728 can go to LL1 only upon failure of the cold cranking power test and in a manner similar to that discussed with respect to what happens when the battery voltage falls below 8 volts, the flip-flop 716 is set when the cold cranking power test is failed and the Q output thereof goes to LL1 thus resetting flip-flop 596 and terminating the cold cranking power test.

When the Q output of flip-flop 716 goes to LL1, the voltage bounce back test commences. That output is the BBTES signal and it is coupled to the control input of transmission gate 564 so that during this test the period of the timer 554 is determined by both resistors 558 and 566. The same output is also coupled to an input of an AND gate 730 having another input coupled to the output of amplifier 582 and an output coupled through OR gate 550 to the set input of flip-flop 552 to commence operation of the timer 554 for the voltage bounce back test. Amplifier 310 (FIG. 2a) produces a LL1 signal when the battery terminal voltage is below the voltage bounce back reference potential. The output of that amplifier is coupled through an inverter 732 (FIG. 2f) to an input of an AND gate 734. Two other inputs of that gate are coupled to the output of amplifier 584 and the Q output of flip-flop 716. Thus, the output of gate 734 can go to LL1 only if the battery terminal voltage is above the voltage bounce back reference potential during the voltage bounce back test and shortly before timer 554 times out. The output of that gate is coupled through an OR gate 736 to the set input of set-reset flip-flop 738 having its Q output coupled to an input of OR gate 524. Thus, when the output of AND gate 234 goes to LL1, flip-flop 738 is set and a LL1 signal is applied from the Q output thereof through OR gate 524 and driver 534 to illuminate BAD lamp 544 and indicate to the operator that the battery under test is not acceptable.

The output of amplifier 310 (FIG. 2a) is also coupled to an input of an AND gate 740 (FIG. 2f) having two other inputs coupled to the Q output of flip-flop 716 and the output of amplifier 584. In a manner similar to that previously discussed for AND gate 734, the output of AND gate 740 can go to LL1 only if the battery terminal voltage is below the voltage bounce back reference potential during the voltage bounce back test and shortly before timer 554 times out. The output of AND gate 740 is coupled to the clock input of a D-type flip-flop 742 having its data input coupled to the $\overline{Q}$ output of flip-flop 718. The IRTES signal at the Q output of flip-flop 742 and the BAD signal at the Q output of flip-flop 738 are both coupled through an OR gate 744 (FIG. 2e) to the reset input of flip-flop 716 to reset that flip-flop at the termination of the voltage bounce back test.

The Q output of flip-flop 742 is also used to initiate the internal impedance test and is coupled to one input of an AND gate 746 having another input coupled to the output of amplifier 582 and its output coupled through OR gate 550 to the set input of flip-flop 552. The Q output of flip-flop 742 (FIG. 2f) is also coupled through OR gate 592 to the control input of transmission gate 564 (FIG. 2e) so that once again the period of timer 554 is controlled primarily by the value of resistor 512.

Figure 2H:
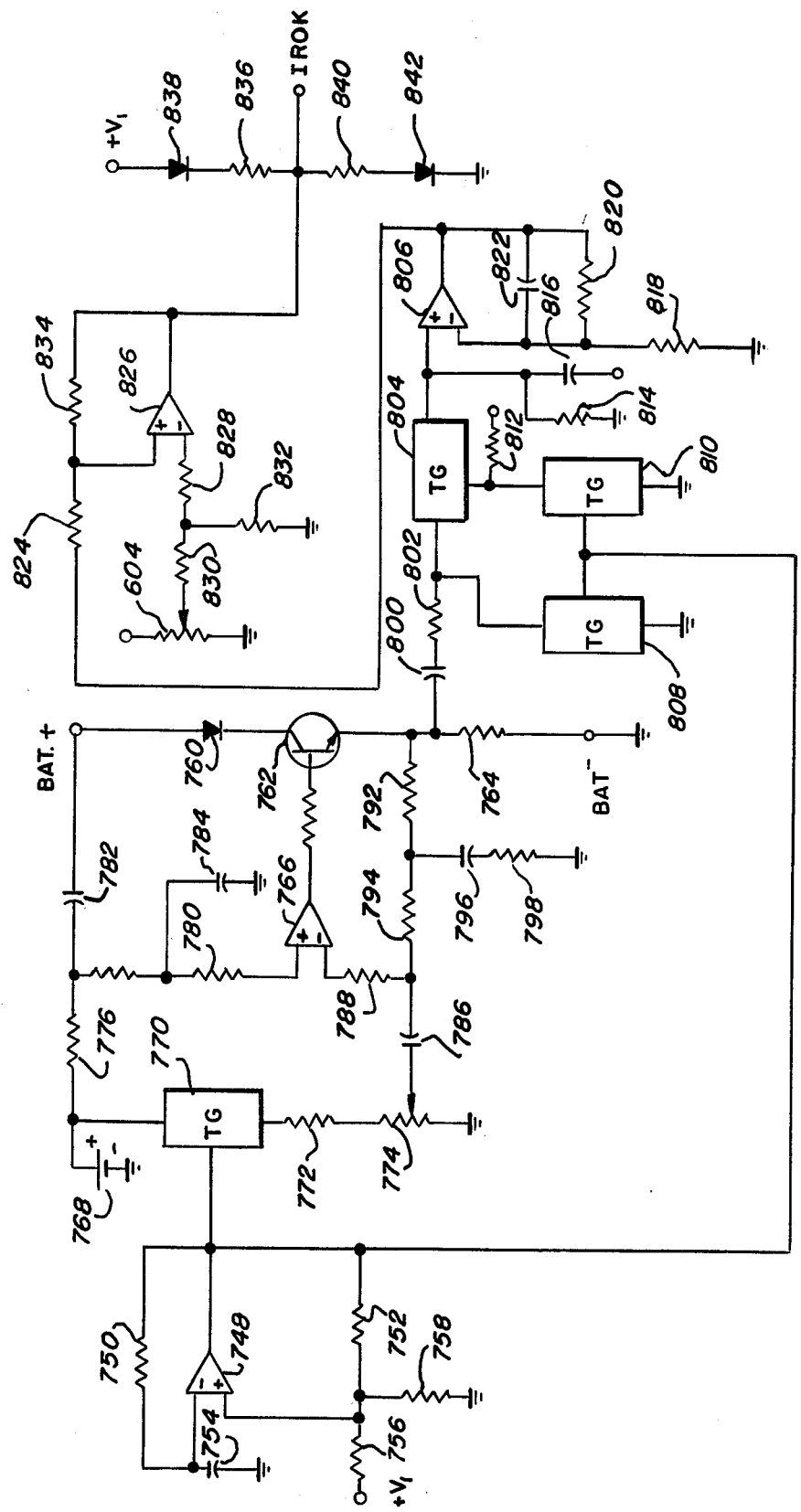

The circuitry for performing the internal impedance test is shown in FIG. 2h. The circuitry shown is responsive to the internal dynamic conductance of the battery under test. Basically, the circuit places a very small, oscillating load at a controlled current level across the battery and measures the resultant alternating voltage appearing across the load. If that voltage is below a specified value, it is known that the battery internal dynamic resistance is excessively high and that the battery needs to be recharged and retested. If that voltage is above the specified value, it is known that the battery dynamic internal resistance is acceptably low and that the battery is acceptable but merely needs to be recharged. The oscillatory frequency of the load is such that the capacitance of the battery plates may be ignored.

In FIG. 2h, an oscillator circuit is included comprised of a differential amplifier 748, feedback resistors 750 and 752 coupled from the output thereof to the inverting and noninverting inputs, respectively, a capacitor 754 coupled between the inverting input and ground, and a voltage divider including resistors 756 and 758 connected in series between the positive potential source +V1 and ground and having its midpoint coupled to the noninverting input of amplifier 748. The series combination of a diode 760 having its anode coupled to the positive terminal of the battery under test, a transistor 762 having its collector coupled to the cathode of diode 760, and a resistor 764 coupled between the emitter of transistor 762 and the negative terminal of the battery under test are provided to develop an oscillatory load across the battery. Circuitry is included for driving transistor 762 with an oscillatory current but at a constant level. The latter circuitry includes a differential amplifier 766. A stable voltage supply such as a mercury battery 768 is provided having its negative terminal coupled to circuit ground and its positive terminal coupled through the series combination of a transmission gate 770, a resistor 772, and the resistance element of a potentiometer 774 to circuit ground. The positive terminal of battery 768 is also coupled through the series combination of three resistors 776, 778 and 780 to the noninverting input of amplifier 766. The junction of resistors 776 and 778 is coupled to the positive terminal of the battery under test through a capacitor 782 and the junction of resistors 778 and 780 is coupled to circuit ground through a capacitor 784. The tap of potentiometer 774 is coupled through the series combination of a capacitor 786 and a resistor 788 to the inverting input of amplifier 766. The output of amplifier 766 is coupled through a resistor 790 to the base of transistor 762 and a feedback network of two resistors 792 and 794 is coupled from the emitter of transistor 762 to the junction of capacitor 786 and resistor 788. The junction resistors 792 and 794 is coupled to ground through the series combination of a capacitor 796 and a resistor 798. The output of amplifier 748 is coupled to the control input of transmission gate 770. The negative terminal of the battery under test is also coupled to ground.

To measure the alternating voltage appearing across resistor 764, the emitter of transistor 762 is coupled through a capacitor 800, a resistor 802, and a transmission gate 804 all in series to the noninverting input of an amplifier 806. The junction of resistor 802 and transmission gate 804 is coupled to ground through a transmission gate 808. The control input of transmission gate 804 is coupled to ground through a transmission gate 810 and to the positive potential source +V1 through a resistor 812. The noninverting input of amplifier 806 is coupled to circuit ground through the parallel combination of a resistor 814 and a capacitor 816, whereas the inverting input is coupled to ground through a resistor 818 and to the output of amplifier 806 through the parallel combination of a resistor 820 and a capacitor 822. The output of amplifier 806 is coupled through a resistor 824 to the noninverting input of a differential amplifier 826. The inverting input of that amplifier is coupled through resistors 828 and 830 to the tap of potentiometer 604 (FIG. 2g) which has been drawn again in FIG. 2h for ease of understanding. The junction of resistors 828 and 830 is coupled to ground through a resistor 832. The output of amplifier 826 is coupled to the noninverting input thereof through a feedback resistor 834. The output of amplifier 826 is also coupled through a resistor 836 to the cathode of a diode 838 having its anode coupled to the positive potential source +V1 and also through a resistor 840 to the anode of a diode 842 having its cathode coupled to ground. The output signal IROK of the circuit of FIG. 2h is taken from the output of amplifier 826.

The oscillator circuit is effective to turn transmission gate 770 alternately on and off at the desired frequency and through amplifier 766 is effective to drive the base-emitter circuit of transistor 762 with a constant level current pulse whenever the output of amplifier 748 is at LL0. Since the base-emitter current of transistor 762 is constant during those pulses, the current flowing in the emitter-collector circuit of transistor 762 and resistor 764 is responsive to the voltage across its emitter-collector terminals and thus to the battery voltage and the battery internal resistance. The amplifier 806 and its associated components is used as an integrator to develop at its output a potential responsive to the average alternating potential across resistor 764. The network of transmission gates 804, 808 and 810 provide that the potential at the noninverting input of amplifier 806 is at ground when the output of amplifier 748 is at LL1 and is responsive to the amplitude of the alternating voltage appearing across resistor 764 when the output of amplifier 748 is at LL0; it thus insures that the output of amplifier 806 is properly referenced to ground. Amplifier 826 compares the output of amplifier 806 with a potential responsive to the setting of potentiometer 604 which potentiometer is set in accord with the cold cranking power rating of the battery. When the measured voltage exceeds that set by potentiometer 604, the output of amplifiers 806 is set at LL1 but otherwise that output is at LL0.

The output of amplifier 826 is coupled to an input of an AND gate 844 (FIG. 2f) having two other inputs coupled to the Q output of flip-flop 742 and the output of amplifier 584. Thus, when the timer 554 times out during the internal impedance test and if the internal impedance of the battery under test is sufficiently low, the output of AND gate 844 goes to LL1. That output is coupled to the clock input of a D-type flip-flop 846 having its data input coupled to the Q output of flip-flop 718. During the internal impedance test, flip-flop 718 will be set so that a LL1 signal at the output of AND gate 844 will cause flip-flop 846 to be set applying at LL1 signal from its Q output through OR gate 526 and driver 536 to illuminate RECH lamp 546 and indicate to the operator that the battery is acceptable but merely needs to be recharged.

The output of amplifier 826 (FIG. 2h) is also coupled through an inverter 848 (FIG. 2f) to an input of an AND gate 854 which, like AND gate 844, has two other inputs coupled to the Q output of flip-flop 742 and the output of amplifier 580 so that if the internal impedance of the battery under test is not sufficiently low, the output of AND gate 850 goes to LL1. That output is coupled to the clock input of a D-type flip-flop 852 having its data input coupled like that of flip-flop 842 to the Q output of flip-flop 718. Thus, an LL1 signal at the output of AND gate 850 will cause flip-flop 852 to be set applying a LL1 signal from its Q output through OR gate 524 and driver 538 to illuminate lamp 548 and indicate to the operator that the acceptability of the battery is undetermined and it must be recharged and retested. The Q outputs of both flip-flops 846 and 852 are coupled through an OR gate 853 to the reset input of flip-flop 742 to reset that flip-flop when the internal impedance test is completed.

Once a battery has been fully charged, only the cold cranking power test needs to be performed to determine whether or not the battery is acceptable. To retest a battery (or to test a battery that is known to be fully charged), the operator momentarily closes a normally open switch 854 (FIG. 2b) which is coupled between circuit ground and a pulse forming circuit of a resistor 856 and a capacitor 858 through an inverter 860 and an AND gate 862 to the set input of a set-reset flip-flop 864. The output of inverter 860 is also coupled to an input of OR gate 508 and a second input of AND gate 862 is coupled to the output of amplifier 302 (FIG. 2a). Closing switch 854 thus initiates the battery test procedure as described above and both the lamp test and the cold cranking power test are performed. However, the Q output of flip-flop 864 is coupled to an input of an AND gate 866 (FIG. 2f) having another input coupled to the output of amplifier 308. Thus, if during retest at the end of the cold cranking power test the battery terminal voltage is below the cold cranking power reference potential (or if during that test the battery terminal potential falls below 8 volts), the battery is known to be bad and the output of AND gate 866 goes to LL1. That output is coupled through OR gate 736 to the set input of flip-flop 738 so that the BAD lamp 544 is illuminated if the cold cranking power test is failed during retest. Of course, if the cold cranking power test is passed during retest, GOOD lamp 542 is illuminated just as it would be during the initial test procedure.

In connection with the tester of FIG. 2, it should be further noted that the Q outputs of flip-flops 726, 738, 846 and 852 (FIGS. 2e and 2f) are all coupled through OR gates 864 and 866 to the reset input of flip-flop 512 (FIG. 2b) to reset that flip-flop when the battery test or retest procedures are completed. Further, the output of AND gate 510 (FIG. 2b) is coupled through an OR gate 868 to the input of a single shot multivibrator circuit 870 to generate a short duration LL1 pulse at the output thereof immediately after one of switches 500 or 854 is closed. That signal is used as shown to insure that all the flip-flops used in the circuit are cleared or reset prior to the commencement of the battery testing procedure. A switch 872 is provided which the operator need only momentarily close if he desires to stop the battery test procedure while it is being performed. That switch is coupled between circuit ground and a resistor 874 coupled to the positive potential source +V1 and to an input of OR gate 868. Closing switch 872 activates the single shot multivibrator causing all the flip-flops in the circuit of FIG. 2 to be reset and terminating the testing operation.

Figure 3B:
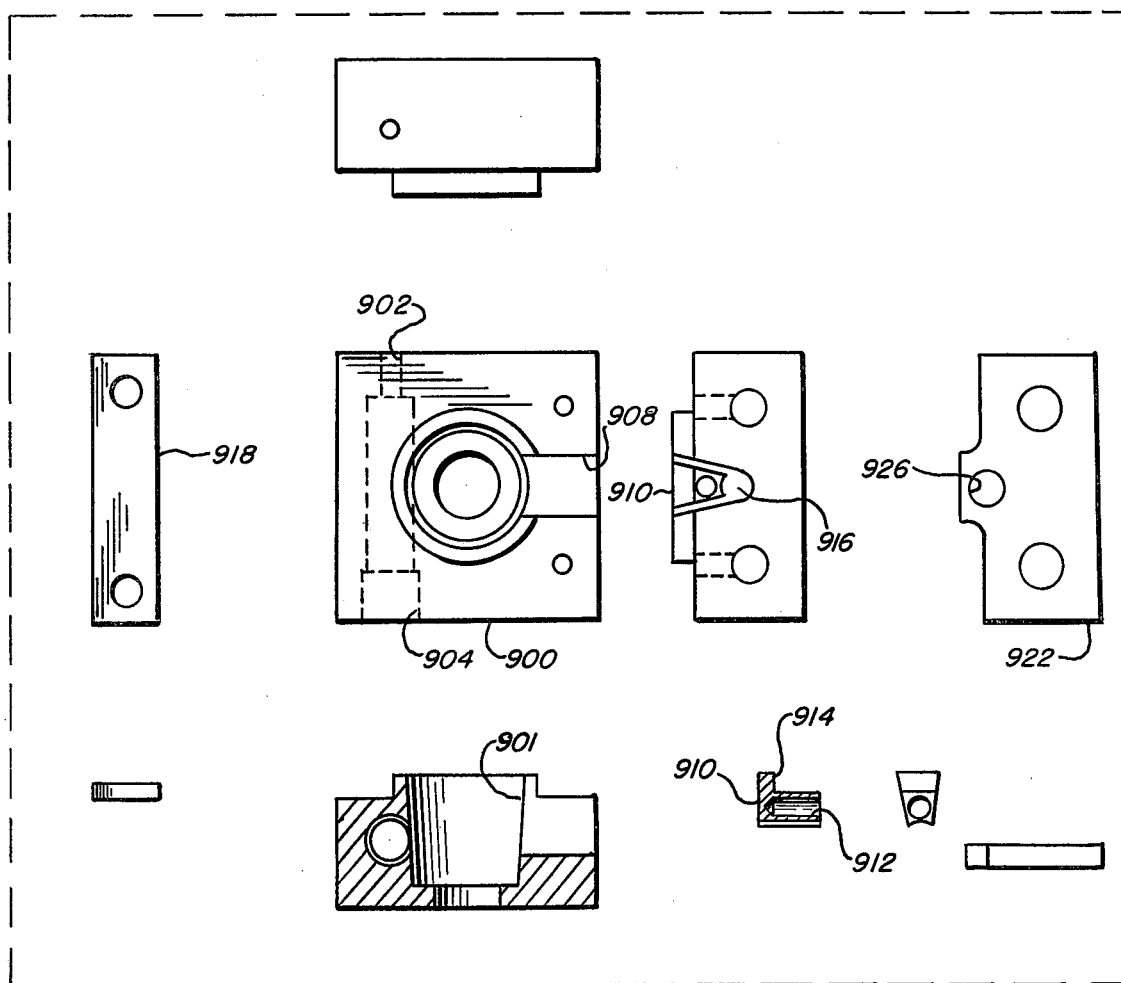
FIG. 3 is divided into FIGS. 3a and 3b which disclose a battery terminal connecting apparatus useful with the automatic battery analyzer of FIG. 2 hereof.
Figure 3A:
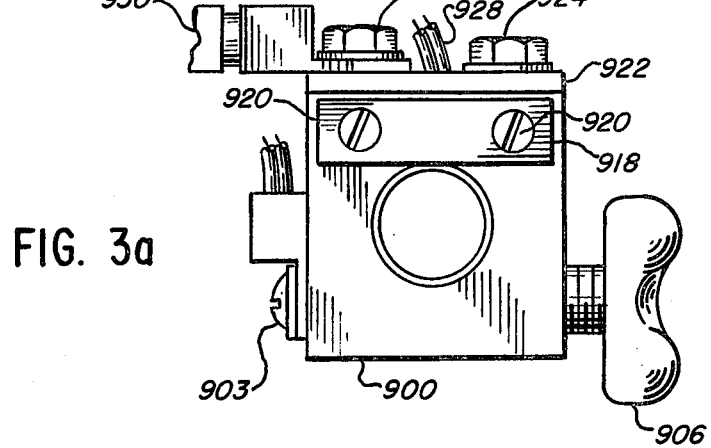

There is disclosed in FIGS. 3a and 3b a connector terminal for attaching the battery tester of FIG. 2 to the negative terminal of the battery under test and including provisions for receiving diode 342 (FIG. 2c) and placing it in thermal contact with the battery terminal. The connector terminal includes a block 900 of thermally and electrically conductive material having a centrally located tapered bore 901 therein for receiving the negative terminal post of the battery under test when the connector terminal is hand pressed onto the terminal. The block 900 also includes a threaded bore 902 for receiving a screw 903 and a threaded bore 904 for receiving a thumb screw 906. Screw 903 provides a point for mechanically connecting necessary electrical leads from the apparatus of FIG. 2 thereto, such as the leads for sensing the battery terminal voltage during the cold cranking power and bounce back tests. Bore 904 is located so that the thumb screw 906 will project slightly into the tapered bore 901. Thumb screw 906 thus provides a means for securing block 900 to the negative battery terminal. The block 900 further includes a cavity 908 therein extending from one side of block 900 to the central bore 902. The cavity 908 receives a diode support bushing 910 having a bore 912 therein for receiving the temperature sensing diode 342. Bushing 910 has a shoe 914 on the extremity thereof adjacent the base 902 for thermally engaging the negative battery post. A cushion member 916 is provided to resiliently receive bushing 910 within cavity 908 and to thermally isolate the bushing 910 and the temperature sensing diode 342 from block 900. A strap 918 is secured to the top of block 900 with two bolts 920 and an end plate 922 is secured to the side of block 900 with two bolts 924 to resiliently retain the bushing 910 and cushion 916 within cavity 908 as shown in FIG. 3. End plate 922 includes a hole 926 therethrough positioned for alignment with the base of bushing 910 so that the leads 928 for diode 342 may be brought out therethrough. Block 900, bushing 910 and end plate 922 are preferably made of brass, strap 918 of berillium copper, and cushion 916 of room temperature vulcanization rubber (known as "RTV") available from General Electric Company and Dow Chemical Corporation. One of bolts 924 may be used to secure a lead 930 used to carry the battery current drawn during the cold cranking power test.

Figure 4B:
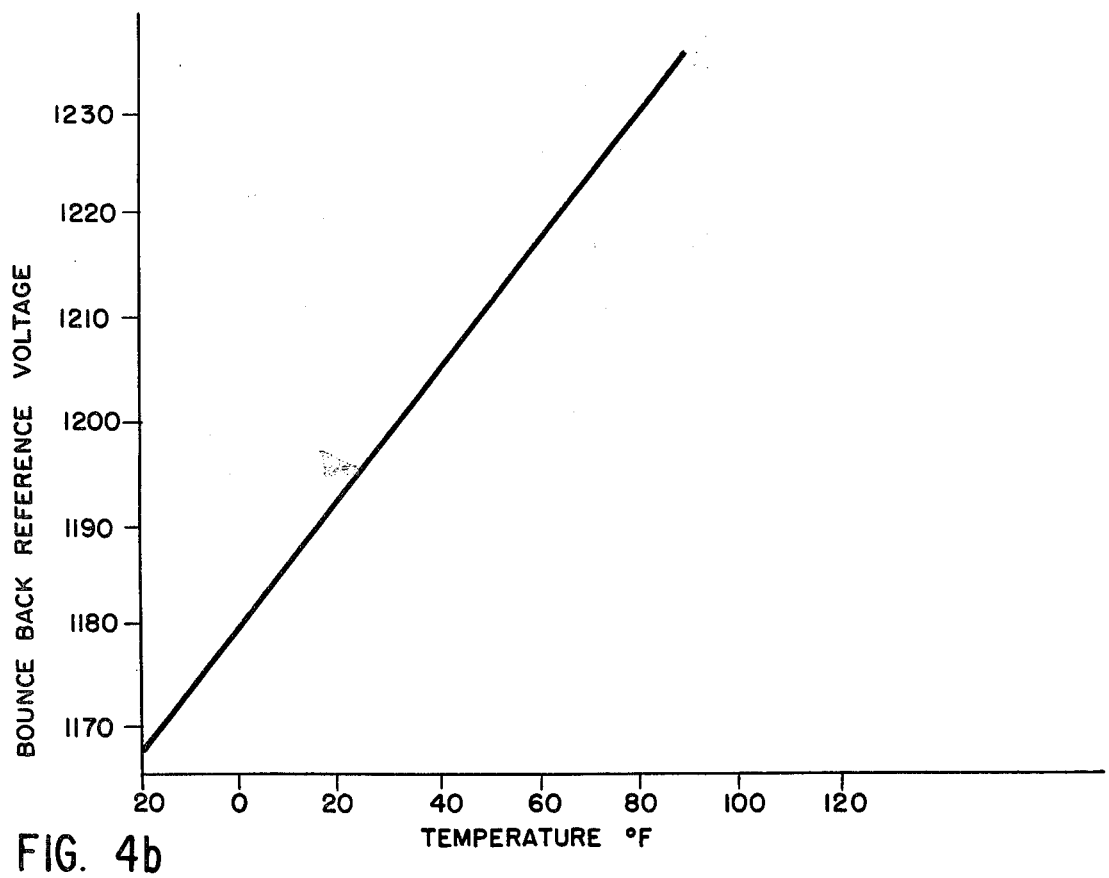
FIG. 4 is divided into FIGS. 4a and 4b which disclose the variations with battery temperature of certain of the parameters associated with the automatic battery analyzer of FIGS. 1 and 2 hereof.
Figure 4A:
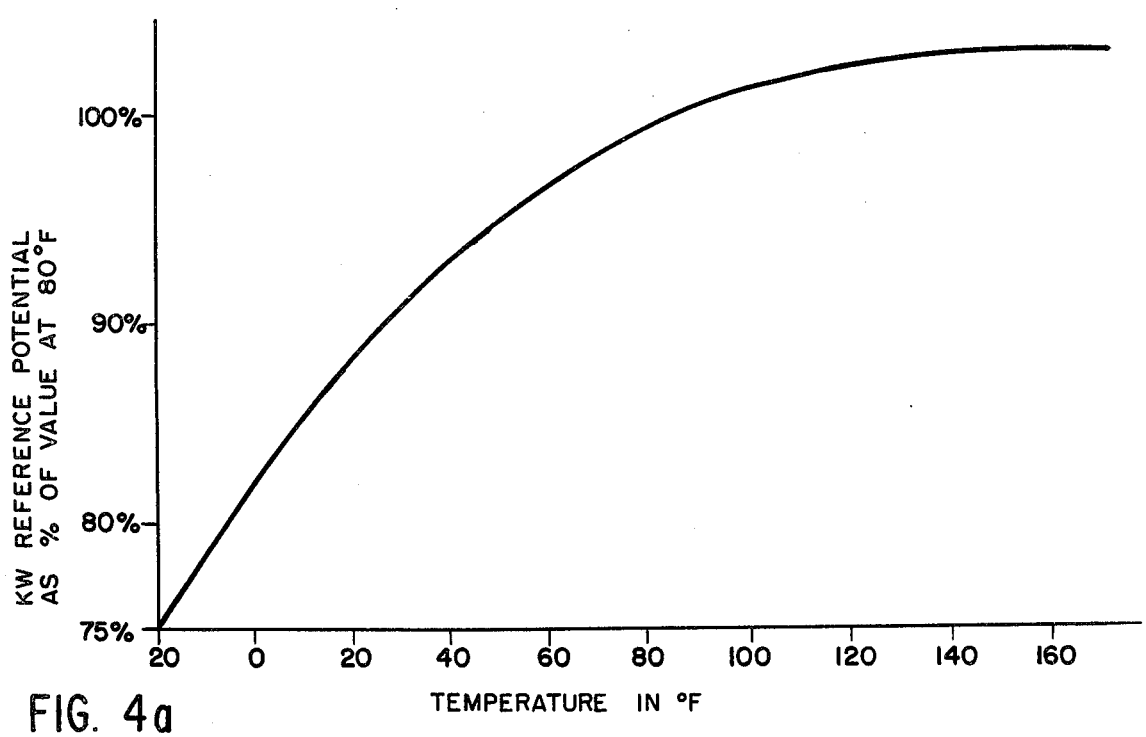

There are disclosed in FIGS. 4a and 4b graphs showing the manner in which the reference voltages for the cold cranking power and bounce back voltage tests, respectively, vary as a function of temperature in degrees Farenheit in the battery tester of FIG. 2. In FIG. 4a, the reference voltage for the cold cranking power test is shown as a percentage of its value at 80 degrees Farenheit. The 80 degree value is known to be 10.0 volts for a conventional, lead-acid storage battery. In the battery tester of FIG. 2, the circuit parameters were adjusted so that during the cold cranking power test a current was drawn from the battery under test equal to approximately one-half of the cold cranking rating of that battery. Moreover, in that tester it was found unnecessary to alter the operation of the dynamic internal resistance test in response to the battery temperature.

It will thus be seen that battery testing apparatus and methods have been provided by this invention which fulfill each of the above-mentioned objects and desiderata. While particular embodiments of the invention have been shown, it will be understood, of course, that the invention is not limited thereto since modifications may be made by those skilled in the art, particularly in light of the foregoing teachings. One modification of particular significance already contemplated would be the use of a microprocessor to perform many of the functions described above as being performed by the circuitry of the embodiments of FIGS. 1 and 2. It is, therefore, contemplated by the appended claims to cover any such modifications as fall within the true spirit and scope of this invention.

We claim:
1. Apparatus for determining the acceptability of a storage battery under test and comprising:
   first circuit means for coupling to the battery under test and performing a load test on said battery;
   second circuit means for coupling to the battery under test and performing a voltage bounce back test on said battery;
   third circuit means for coupling to the battery under test and performing a test of an internal circuit parameter of said battery; and
   fourth circuit means coupled to said first, second, and third circuit means for controlling the sequence in which the tests of said first, second, and third cir- cuit means are performed and providing a readout responsive to outputs of said first, second, and third testing means.

2. The apparatus of claim 1 wherein said fourth circuit means comprises means to provide that said load test is the first of said tests to be performed on the battery under test, said voltage bounce back test is the second of said tests to be performed on the battery under test, and said internal circuit parameter test is the third of said tests to be performed on the battery under test.

3. The apparatus of claim 2 wherein said fourth circuit means further comprises means to provide a readout that the battery under test is acceptable if said load test is passed.

4. The apparatus of claim 3 wherein said fourth circuit means further comprises means to prevent the occurrence of said voltage bounce back test and said internal circuit parameter test if said load test is passed.

5. The apparatus of claim 3 wherein said fourth circuit means further comprises means to provide a readout that the battery under test is unacceptable if said voltage bounce back test is passed.

6. The apparatus of claim 5 wherein said fourth circuit means further comprises means to prevent the occurrence of said internal circuit parameter test if said voltage bounce back test is passed.

7. The apparatus of claim 6 wherein said fourth circuit means further comprises means to provide a readout that the battery under test should be recharged and retested if said internal circuit parameter test is failed.

8. The apparatus of claim 7 wherein said fourth circuit means further comprises means to provide a readout that the battery under test is acceptable but should be recharged if said internal circuit parameter test is passed.

9. The apparatus of claim 1 wherein said internal circuit parameter is the internal resistance of the battery under test.

10. The apparatus of claim 1 wherein said first circuit means further comprises means for maintaining a constant current load on said battery and determining whether the battery terminal voltage is above a first predetermined level at the end of a first predetermined time period following the application of said constant current load to said battery.

11. The apparatus of claim 1 wherein said second circuit means further comprises means for determining whether the battery terminal voltage is above a second predetermined level at the end of a second predetermined time period following the removal of a load from said battery.

12. The apparatus of claim 10 wherein said second circuit means further comprises means for determining whether the battery terminal voltage is above a second predetermined level at the end of a second predetermined time period following the removal of said constant current load from said battery.

13. Apparatus for determining the acceptability of a storage battery under test and comprising:
first circuit means for coupling to the battery under test;
second circuit means coupled to said first circuit means for maintaining a load on said battery and providing an output signal responsive to the battery terminal voltage at the end of a first predetermined time period following the application of said load to said battery;
third circuit means coupled to said first circuit means and providing an output signal responsive to the battery terminal voltage at the end of a second predetermined time period following the removal of said load from said battery;
fourth circuit means coupled to said first circuit means and providing an output signal responsive to the value of an internal circuit parameter of said battery; and
fifth circuit means coupled to said second, third, and fourth circuit means and controlling the sequence in which said output signals are generated and providing a readout indicative of the acceptability of said battery in response to said output signals.

14. Apparatus for determining the acceptability of a battery under test and comprising:
first circuit means for coupling to the battery under test;
second circuit means coupled to said first circuit means for maintaining a constant current load on said battery for a first predetermined period of time and providing a first output signal having a first state when the battery terminal voltage at the end of a first predetermined time period following the application of said constant current load is above a first predetermined level and a second state when the battery terminal voltage at the end of said first predetermined time period following the application of said constant current load is below said first predetermined level;
third circuit means coupled to said first circuit means and providing a second output signal having a first state when the battery terminal voltage at the end of a second predetermined time period following the removal of said constant current load is above a second predetermined level and a second state when the battery terminal voltage at the end of said second predetermined time period following the removal of said constant current load is below said second predetermined level;
fourth circuit means coupled to said first circuit means and providing a third output signal having a first state when an internal circuit parameter is above a third predetermined level and a second state when said internal circuit parameter is below said predetermined level; and
fifth circuit means coupled to said second, third, and fourth circuit means and controlling the sequence in which said output signals are generated and providing a first output indicating that the battery under test is acceptable when said first output signal is in said first state, a second output indicating that the battery under test is unacceptable when said first output signal is in said second state and said second output signal is in said first state, and a third output indicating whether said battery should be retested in response to said third output signal when said first output signal is in said second state and said second output signal is in said second state.

15. The apparatus of claim 14 wherein said fifth circuit means further includes means coupled to said second circuit means for disabling operation of said third circuit means and said fourth circuit means when said first output signal is in said first state and means coupled to said third circuit means for disabling operation of said fourth circuit means when said first output signal is in said second state and said second output signal is in said first state.

16. The method of determining the acceptability of an electrical storage battery comprising:

the first step of performing an electrical load test on said battery;
the second step of performing a voltage bounce back test on said battery;
the third step of performing a test responsive to the magnitude of an internal circuit parameter of said battery;
the fourth step of determining from the results of said first, second, and third steps the acceptability of said battery.

17. The method of determining the acceptability of an electrical storage battery comprising:

the first step of placing a load on said battery, determining whether the battery terminal voltage is above a first predetermined level after a first predetermined period of time, and removing said load from said battery;
the second step of determining whether the battery terminal voltage is above a second predetermined level after a second predetermined period of time following the removal of said load from said battery;
the third step of determining whether an internal circuit parameter of said battery is above a third predetermined value;
the fourth step of determining from the results of said first, second, and third steps whether said battery is acceptable.

18. The method of claim 17 wherein said first, second, and third steps are performed in the order recited.

19. The method of claim 18 wherein said fourth step further comprises the steps of:

generating an indication that the battery under test is acceptable when the battery terminal voltage is above said first predetermined level after said first period of time;
generating an indication that the battery under test is unacceptable when the battery terminal voltage is below said first predetermined level after said first period of time and above said second predetermined level after said second period of time; and
generating an indication that the battery under test should be retested in response to the results of said third step when the battery terminal voltage is below said first predetermined level after said first period of time and below said second predetermined level after said second period of time.

* * * * *